(12) United States Patent
Kim et al.

(10) Patent No.: US 11,475,948 B2
(45) Date of Patent: Oct. 18, 2022

(54) MEMORY DEVICE AND OPERATING METHOD OF MEMORY DEVICE

(71) Applicant: Samsung Electronics Co., Ltd., Suwon-si (KR)

(72) Inventors: Jongryul Kim, Dangjin-si (KR); Jinyoung Kim, Seoul (KR); Taehui Na, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 28 days.

(21) Appl. No.: 16/999,189

(22) Filed: Aug. 21, 2020

(65) Prior Publication Data

US 2021/0090651 A1    Mar. 25, 2021

(30) Foreign Application Priority Data

Sep. 25, 2019  (KR) .......................... 10-2019-0118378

(51) Int. Cl.
*G11C 11/00* (2006.01)
*G11C 13/00* (2006.01)
*G11C 11/56* (2006.01)

(52) U.S. Cl.
CPC ...... *G11C 13/0033* (2013.01); *G11C 11/5678* (2013.01); *G11C 13/003* (2013.01); *G11C 13/0004* (2013.01); *G11C 13/004* (2013.01); *G11C 13/0026* (2013.01); *G11C 13/0028* (2013.01); *G11C 2213/76* (2013.01)

(58) Field of Classification Search
CPC ............ G11C 13/0033; G11C 13/0004; G11C 13/0026; G11C 11/5678
USPC ....................................................... 365/163
See application file for complete search history.

(56) References Cited

U.S. PATENT DOCUMENTS

| 5,808,338 A | 9/1998 | Gotou |
| 7,430,138 B2 | 9/2008 | Higashitani |
| 7,450,433 B2 | 11/2008 | Wan et al. |

(Continued)

FOREIGN PATENT DOCUMENTS

| JP | H11-185481 A | 7/1999 |
| KR | 10-0179776 B1 | 11/1998 |
| KR | 2012-0033926 A | 4/2012 |

OTHER PUBLICATIONS

Office Action dated Jul. 11, 2022 issued in corresponding German patent application No. 10 2020 121 113.9.

*Primary Examiner* — Vu A Le
(74) *Attorney, Agent, or Firm* — Harness, Dickey & Pierce, P.L.C.

(57) ABSTRACT

A memory device and a method of operating the same. The memory device includes a memory cell array including a plurality of memory cells disposed in an area where a plurality of word lines and a plurality of bit lines cross each other; a row decoder including row switches and configured to perform a selection operation on the plurality of word lines; a column decoder including column switches and configured to perform a selection operation on the plurality of bit lines; and a control logic configured to control, in a data read operation, a precharge operation to be performed on a selected word line in a word line precharge period, and to control a precharge operation to be performed on a selected bit line in a bit line precharge period; wherein a row switch connected to the selected word line is weakly turned on in the bit line precharge period.

26 Claims, 34 Drawing Sheets

(56) References Cited

U.S. PATENT DOCUMENTS

| | | |
|---|---|---|
| 7,606,074 B2 | 10/2009 | Wan et al. |
| 7,782,677 B2 | 8/2010 | Roohparvar |
| 7,821,825 B2 | 10/2010 | Park et al. |
| 8,331,181 B2 | 12/2012 | Murata |
| 8,416,638 B2 | 4/2013 | Kim et al. |
| 8,743,617 B2 | 6/2014 | Shim et al. |
| 8,897,064 B2 | 11/2014 | Chen et al. |
| 9,543,005 B2 | 1/2017 | Guliani et al. |
| 10,134,469 B1 | 11/2018 | Liu et al. |
| 10,248,351 B1 | 4/2019 | Banerjee et al. |
| 10,475,511 B1 * | 11/2019 | Liu .................... G11C 13/0028 |
| 2007/0070745 A1 * | 3/2007 | Versen .................... G11C 7/12 |
| | | 365/203 |
| 2015/0063021 A1 | 3/2015 | Castro et al. |
| 2019/0043576 A1 | 2/2019 | Banerjee et al. |

* cited by examiner

MEMORY DEVICE AND OPERATING METHOD OF MEMORY DEVICE

CROSS-REFERENCE TO RELATED APPLICATION

This application claims the benefit of Korean Patent Application No. 10-2019-0118378, filed on Sep. 25, 2019, in the Korean Intellectual Property Office, the disclosure of which is incorporated herein in its entirety by reference.

BACKGROUND

The inventive concepts relate to a memory device, and more particularly, to a resistive memory device and a reading method of the resistive memory device.

As a nonvolatile memory device, besides a flash memory device, resistive memory devices such as phase change RAM (PRAM), nano floating gate memory (NFGM), polymer RAM (PoRAM), magnetic RAM (MRAM), ferroelectric RAM (FeRAM), resistive RAM (RRAM) are known. A resistive memory device may have the nonvolatile characteristics of flash memory with the higher speed characteristics of dynamic random access memory (DRAM).

Memory cells of a resistive memory device may have a resistance distribution according to programmed data. In a read operation of data stored in the memory cells, data may be sensed by applying a constant current or voltage to the memory cell and reading a voltage that varies according to the size of resistance of the memory cell. Word lines and bit lines connected to the memory cells may each have parasitic capacitor components, and capacitance may affect sensing margin and read disturb characteristics. On the other hand, in a memory device having a three-dimensional cross point structure, when first and second layers stacked vertically share bit lines, capacitances of word lines of the first layer and word lines of the second layer may be different, and thus the sensing margin and the read disturb characteristics of the first layer and the second layer may be different.

SUMMARY

The inventive concepts provide a memory device and an operating method of the memory device capable of increasing the sensing margin and/or reducing the read disturb.

According to an aspect of the inventive concepts, there is provided a memory device including: a memory cell array including a plurality of memory cells in an area where a plurality of word lines and a plurality of bit lines cross each other; a row decoder including a plurality of row switches corresponding to the plurality of word lines and configured to perform a selection operation on the plurality of word lines; a column decoder including a plurality of column switches corresponding to the bit lines and configured to perform a selection operation on the plurality of bit lines; and a control logic configured to control a precharge operation to be performed on a selected word line connected to a selected memory cell in a word line precharge period in a data read operation, and to control a precharge operation to be performed on a selected bit line connected to the selected memory cell in a bit line precharge period after the word line precharge period; wherein the row switch connected to the selected word line is weakly turned on in the bit line precharge period.

According to an aspect of the inventive concepts, there is provided a memory device including: a memory cell array including a first layer and a second layer which share a plurality of bit lines and are stacked, wherein each of the first layer and the second layer includes a plurality of memory cells in an area where a plurality of word lines and the plurality of bit lines cross each other; a row decoder including a plurality of row switches corresponding to the plurality of word lines and configured to perform a selection operation on the plurality of word lines; a column decoder including a plurality of column switches corresponding to the plurality of bit lines and configured to perform a selection operation on the plurality of bit lines; a word line precharge device configured to apply a word line precharge voltage to a selected word line selected by the row decoder in a word line precharge period; a bit line precharge device configured to apply a bit line precharge voltage to a selected bit line selected by the column decoder in a bit line precharge period; and a comparator including a voltage of the selected word line to a reference voltage and outputting a comparison result, wherein when a data read operation is performed on a first memory cell of the first layer, a first world line selection signal of a first level is applied to a first row switch connected to the first memory cell for turning on the first row switch in the word line precharge period, and the first word line selection signal of a third level between a second level and the first level is applied to the first row switch for turning off the first row switch in the bit line precharge period.

According to an aspect of the inventive concepts, there is provided a memory module including: a module board; a plurality of memory chips on the module board; and a nonvolatile memory on the module board and communicating with the plurality of memory chips, each of the plurality of memory chips including: a memory cell array including a first layer and a second layer which share a plurality of bit lines and are stacked, wherein each of the first layer and the second layer includes a plurality of memory cells in an area where a plurality of word lines and the plurality of bit lines cross each other; a row decoder including a plurality of row switches corresponding to the plurality of word lines and configured to perform a selection operation on the plurality of word lines; a column decoder comprising a plurality of column switches corresponding to the plurality of bit lines and configured to perform a selection operation on the plurality of bit lines; and a control logic configured to control precharge operations on a word line and a bit line of a selected memory cell, wherein when a read operation is performed on a first memory cell of the first layer, a first word line selection signal of a weak-on level is applied to a first row switch connected to the first memory cell in a bit line precharge period, and wherein when a read operation is performed on a second memory cell of the second layer, a second word line selection signal of an off level is applied to a second row switch connected to the second memory cell in a bit line precharge period.

According to an aspect of the inventive concepts, there is provided an operating method of a memory device, wherein the memory device includes a plurality of word lines, a plurality of bit lines, and a plurality of memory cells disposed in an area where the plurality of word lines and the plurality of bit lines cross each other, each of the plurality of memory cells includes a variable resistance device and a selection device, the operating method including: precharging a selected word line connected to a selected memory cell among the plurality of memory cells in a first precharge period; precharging a selected bit line connected to the selected memory cell while weakly turning on a row switch for connecting the selected word line to a data line in a second precharge period; connecting the selected word line to the data line; and sensing data of the selected memory cell based on a voltage of the data line.

According to an aspect of the inventive concepts, there is provided a memory device including: a memory cell array including a first layer and a second layer which share a plurality of bit lines and are stacked vertically, wherein each of the first layer and the second layer includes a plurality of memory cells in an area where a plurality of word lines and the plurality of bit lines cross each other; a row decoder including a plurality of row switches corresponding to the plurality of word lines and configured to perform a selection operation on the plurality of word lines; a column decoder including a plurality of column switches corresponding to the bit lines and configured to perform a selection operation on the plurality of bit lines; a read circuit configured to read data of a selected memory cell based on a voltage level of a selected word line connected to the selected memory cell among the plurality of memory cells; and a control logic for controlling such that when a data reading is performed on a first memory cell of the first layer, N (N is zero or a positive integer) unselected word lines among a plurality of unselected word lines of the first layer are floated, and when the data read operation is performed on a second memory cell of the second layer, M (M is a positive integer greater than N) unselected word lines among the plurality of unselected word lines of the second layer are floated.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF EMBODIMENTS

Hereinafter, example embodiments of the inventive concepts will be described in detail with reference to the accompanying drawings.

Figure 1:
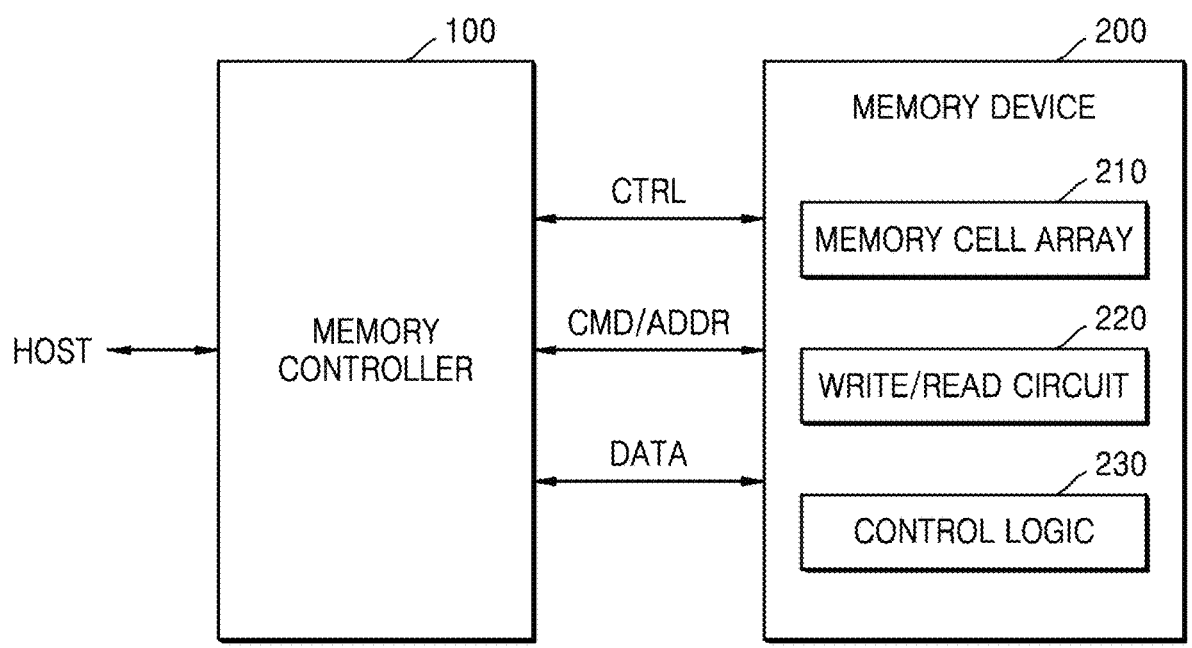
FIG. 1 is a block diagram illustrating a memory system including a memory device according to an example embodiment of the inventive concepts.

FIG. 1 is a block diagram illustrating a memory system including a memory device according to an example embodiment of the inventive concepts. In some embodiments of the inventive concepts, a memory device 200 may be referred to as a resistive memory device as it includes resistive memory cells. Alternatively, in embodiments of the inventive concepts, the memory device 200 may include other various types of memory cells. In addition, as the memory device 200 may be disposed in an area where a plurality of first signal lines and a plurality of second signal lines cross each other, the memory device 200 may be referred to as a cross-point memory device. For example, the memory device 200 may include a plurality of layers, and layers adjacent to each other may be configured to share at least one signal line. In the following embodiments, it may be assumed that the memory device 200 is a resistive memory device.

The memory device 200 of FIG. 1 may be implemented in various forms. As an example, the memory device 200 may be a device to be implemented as one memory chip. Alternatively, the memory device 200 may be defined as a device including a plurality of memory chips. For example, the memory device 200 may be a memory module in which the plurality of memory chips are mounted on a board. However, embodiments of the inventive concepts are not limited thereto, and the memory device 200 may be implemented in various forms such as a semiconductor package including one or more memory dies.

Referring to FIG. 1, a memory system 10 may include a memory controller 100 and the memory device 200. The memory device 200 may include a memory cell array 210, a write/read circuit 220, and/or a control logic 230. In addition, the memory controller 100 may include a processor, and under the control of the processor, the memory controller 100 may control various memory operations with respect to the memory device 200 in a manner based on hardware, software, and a combination thereof.

The memory controller 100 may control the memory device 200 to read data stored in the memory device 200, or to write data to the memory device 200, in response to a write/read request from a host HOST. For example, the memory controller 100 may provide an address ADDR, a command CMD, and/or a control signal CTRL to the memory device 200, thereby controlling program (or write), read and erase operations with respect to the memory device 200. In addition, data DATA to be written and read may be transmitted and received between the memory controller 100 and the memory device 200.

Although not shown, the memory controller 100 may include a RAM, a processing unit, a host interface, and a memory interface. The RAM may be used as an operating memory of the processing unit. The processing unit may control an operation of the memory controller 100. The host interface may include a protocol for exchanging data between the host and the memory controller 100. The memory controller 100 may be configured to communicate with the host through at least one of various protocols, for example, such as USB, MMC, PCI-E, advanced technology attachment (ATA), serial-ATA, parallel-ATA, SCSI, ESDI, and integrated drive electronics (IDE).

The memory cell array 210 may include a plurality of memory cells respectively disposed in regions where the plurality of first signal lines and the plurality of second signal lines cross each other. In some embodiments, the first signal line may be one of a bit line and a word line, and the second signal line may be another one of the bit line and the word line. In addition, each of the plurality of memory cells may be a single level cell (SLC) that may store one bit of data, or may be a multi level cell (MLC) that may store at least two or more bits of data. In addition, the memory cells may have a plurality of resistance distributions according to the number of bits to be stored in each memory cell. In some embodiments, when one bit of data is written to one memory cell, the memory cells may have two resistance distributions. When two bits of data are stored in one memory cell, the memory cells may have four resistance distributions.

The memory cell array 210 may include resistive memory cells including a variable resistance device. For example, when the variable resistance device includes a phase change material and the resistance changes with temperature, the resistive memory device may be a phase change random access memory (PRAM). In another embodiment, when the variable resistance device includes an upper electrode, a lower electrode, and a transition metal oxide therebetween, the resistive memory device may be an RRAM. In still other embodiments, when the variable resistance device includes an upper electrode of a magnetic material, a lower electrode of the magnetic material, and a dielectric material therebetween, the resistive memory device may be an MRAM.

The write/read circuit 220 may provide a constant voltage or current to a selected memory cell through a selected first signal line or a selected second signal line connected to the selected memory cell in data write and read operations with respect to the selected memory cell among the plurality of memory cells. For example, when the read operation is performed, the write/read circuit 220 may provide precharge voltages to the selected first signal line and/or the selected second signal line, and then may sense voltage levels of the selected first signal line or the selected second signal line.

The control logic 230 may perform memory operations such as data writing and reading by controlling various components of the memory device 200. As an example, the control logic 230 may generate control signals for controlling a level of a plurality of voltages, a time to be applied of the plurality of voltages, the selection of the plurality of voltages, and the like, in which the plurality of voltages may be applied to signal lines connected to the selected memory cell and/or a circuit for driving the signal lines, for example, a row decoder 240 in FIG. 2, a column decoder 250 in FIG. 2, and a write/read circuit 220, and the like.

In a read operation of the memory cell array 210, a read voltage may be respectively provided to a selected word line (hereinafter referred to as a word line) and a selected bit line (hereinafter referred to as a bit line) connected to the selected memory cell. As an example, a first precharge voltage may be provided to the word line and a second precharge voltage may be provided to the bit line such that the voltage between the word line and the bit line may have a level difference corresponding to a predetermined or alternatively, desired setting value. In addition, after a precharge operation with respect to the word line and the bit line is completed, the level of voltage to be detected from at least one of the word line and the bit line may vary differently according to a program state (e.g., a set state or a reset state) of the selected memory cell.

As an example, when an operation of sensing data using the voltage detected from the word line is performed, the level of the voltage detected from the word line may be different according to the program state of the selected memory cell. When the level of the voltage detected from the word line is greater than a predetermined or alternatively, desired reference level, data of "0" may be sensed as the selected memory cell may be in the set state, and when the level of the voltage detected from the word line is less than the predetermined or alternatively, desired reference level, data of "1" may be sensed as the selected memory cell may be in the reset state. In various embodiments, the memory device 200 may be implemented to sense data using the voltage detected from the bit line. Alternatively, the memory device 200 may be implemented such that data of "1" may be sensed when the selected memory cell is in the set state and data of "0" may be sensed when the selected memory cell is in the reset state.

In the read operation as described above, the word lines and the bit lines may respectively have a capacitance component (e.g., a parasitic capacitor). For example, word lines and bit lines may have their own capacitor components, a capacitor component due to adjacent lines, a capacitor component due to memory cells connected thereto, and a capacitor component due to peripheral circuits connected to the word lines and bit lines (e.g., a driver circuit and a sensing circuit, and the like). Such a capacitor component of each of the word lines and the bit lines may affect the sensing margin and the read disturb characteristics.

For example, when the capacitances of the word line and/or the bit line are large, a large amount of current may flow through the memory cell and thus a temperature of the memory cell may increase. This may cause the read disturb. In addition, in a read method of sensing data based on the level of the voltage of the word line or the bit line, when the capacitance of the word line or the bit line is small, the sensing margin may be reduced. In addition, in a memory device having a vertical three-dimensional cross point structure, when the first and second layers stacked vertically share bit lines, capacitances of word lines of the first layer and word lines of the second layer may be different, and thus the sensing margin and/or the read disturb characteristics of the first layer and the second layer may be different.

However, according to an example embodiment of the inventive concepts, by compensating for parasitic capacitor components of the word line or the bit line, or by compensating for capacitance differences between the first layer and the second layer, the sensing margin may be increased and the read disturb may be reduced.

In some embodiments, after the word line and the bit line are precharged and then the word line and the data line are charge-shared, data may be sensed based on the voltage of the data line, whereby data with respect to the memory cell may be read. At this time, a word line selection switch, for example, a word line selection transistor connected between the word line and the data line may be weakly turned on in a bit line precharge period, whereby the sensing margin may be increased by causing an effect of the increase in the parasitic capacitor component of the word line. For example, the word line selection transistor connected to the word line in the bit line precharge period may be turned off in response to an off-level control signal, thereby causing the word line to be floated. In the memory device 200 according to an embodiment of the inventive concepts, the word line selection transistor connected to the word line may be weakly turned on in response to a weak-on level control signal to increase the sensing margin, whereby the word line may be pseudo-floating.

In some embodiments, the memory cell array 210 may include a first layer and a second layer stacked vertically, and when the read operation is performed on a first memory cell located in the first layer, a first word line selection transistor connected to the first memory cell through the first word line in the bit line precharge period may be weakly turned on and thus the first word line may be pseudo-floating, and when the read operation is performed on the second memory cell located in the second layer, a second word line selection transistor connected to the second memory cell through the second word line in the bit line precharge period may be turned off and thus the second word line may be floated, or the second word line may be pseudo-floating more strongly than the first word line. In other words, a level of the control signal to be applied to the second word line selection transistor may be closer to a turn-off level than the level of the control signal to be applied to the first word line selection transistor.

In some embodiments, the memory cell array 210 may include the first layer and the second layer stacked vertically, and when the word line parasitic capacitor component of the second layer is greater than the word line parasitic capacitor component of the first layer, unselected word lines may be biased based on an inhibit voltage in the read operation with respect to the first layer and the unselected word lines adjacent to the selected word line in the bit line precharge period may be floated in the read operation with respect to the second layer. Accordingly, the read disturb characteristics of the first layer may become the same as or similar to that of the second layer. Alternatively, when the read operation is performed on the first layer and the second layer, the unselected word lines adjacent to the selected word line in the bit line precharge period may be floated, wherein the number of the unselected word lines to be floated may be different in the first layer and the second layer.

According to example embodiments of the inventive concepts as described above, the sensing margin may be increased by the effect of increasing of the capacitance of the word line and the sensing margin of the first layer may become the same as or similar to that of the second layer. In addition, since the capacitance difference between the word line of the first layer and the word line of the second layer may be compensated, the read disturb characteristics of the first layer and the second layer may become the same or similar.

The memory controller 100 and the memory device 200 may be implemented as separate semiconductor devices. Alternatively, the memory controller 100 and the memory device 200 may be integrated into one semiconductor device. For example, the memory controller 100 and the memory device 200 may be integrated into one semiconductor device to configure a memory card. For example, the memory controller 100 and the memory device 200 may be integrated into one semiconductor device and may configure a PC card (PCMCIA), a compact flash card (CF), a smart media card (SM/SMC), a memory stick, a multimedia card (e.g., MMC, RS-MMC, MMCmicro), a SD card (e.g., SD, miniSD, microSD), an universal flash memory device (UFS), and the like.

Figure 2:
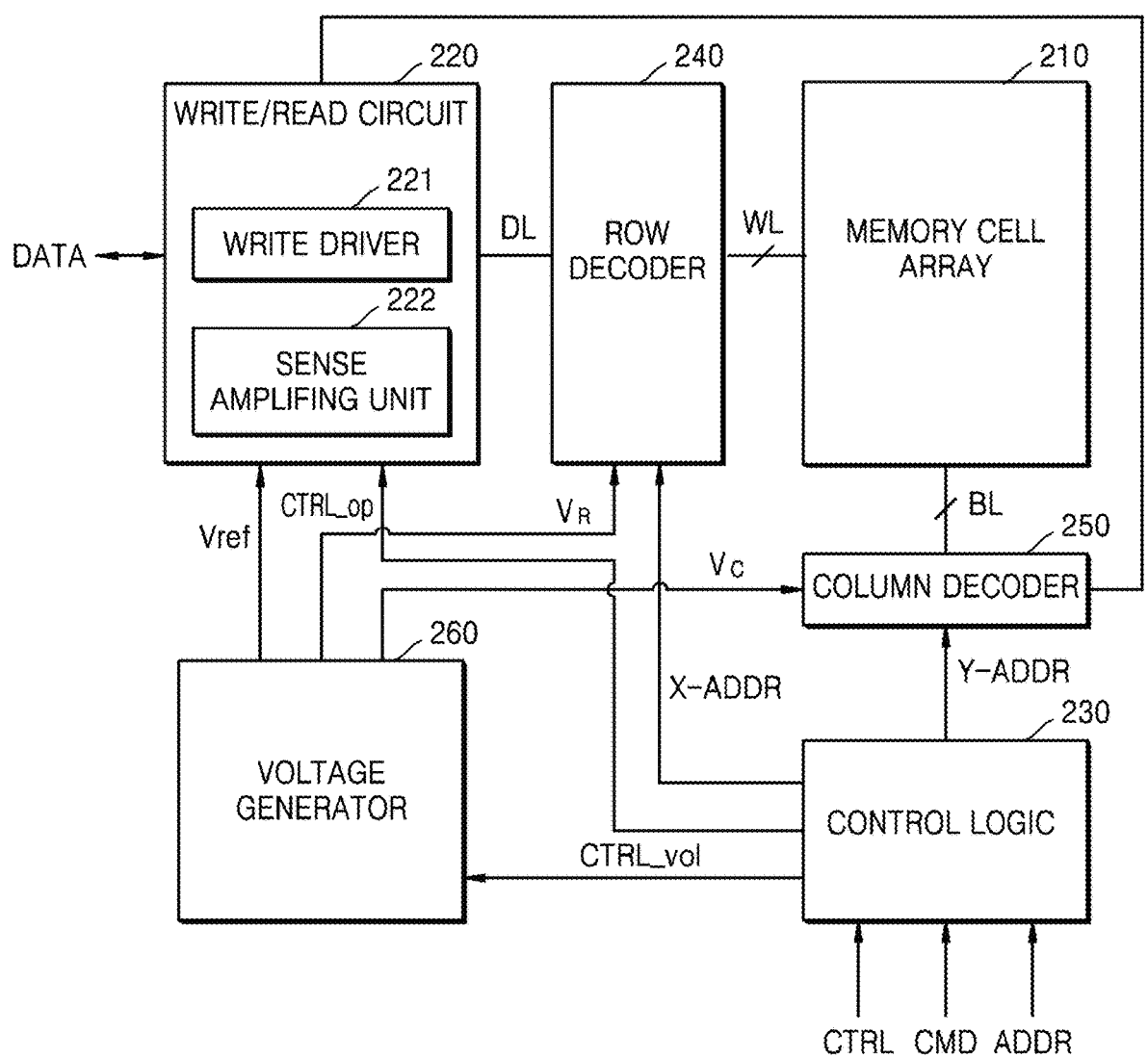
FIG. 2 is a block diagram illustrating a memory device according to an example embodiment of the inventive concepts.

FIG. 2 is a block diagram illustrating a memory device according to an example embodiment of the inventive concepts.

Referring to FIG. 2, the memory device 200 may include the memory cell array 210, the write/read circuit 220, the control logic 230, the row decoder 240, the column decoder 250, and/or a voltage generator 260. The write/read circuit 220 may include a write driver 221 and a sense amplifying unit 222.

The memory cell array 210 may be connected to the plurality of first signal lines and the plurality of second signal lines. In addition, the memory cell array 210 may include the plurality of memory cells respectively disposed in regions where the plurality of first signal lines and the plurality of second signal lines cross each other. Hereinafter, a case in which the plurality of first signal lines are word lines WL and the plurality of second signal lines are bit lines BL will be described as an example.

The write driver 221 may be selectively connected to the bit line BL and/or the word line WL and may provide a write current to the selected memory cell. As a result, the write driver 221 may program data DATA to be stored in the memory cell array 210.

The sense amplifying unit 222 may be selectively connected to the bit line BL and/or the word line WL and may read data written in the selected memory cell. For example, the sense amplifying unit 222 may detect a voltage from the word line WL connected to the selected memory cell and may amplify the same to output read data DATA.

The control logic 230 may write data to the memory cell array 210 or may output various control signals in order to read data from the memory cell array 210, based on the command CMD, the address ADDR, and the control signal CTRL received from the memory controller 100 in FIG. 1. As a result, the control logic 230 may control various operations in the memory device 200 on the whole.

Various control signals output from the control logic 230 may be provided to the write/read circuit 220, the voltage generator 260, the row decoder 240, and the column decoder 250. For example, the control logic 230 may provide an operation selection signal CTRL_op to the write/read circuit 220, may provide a voltage control signal CTRL_vol to the voltage generator 260, may provide a row address X_ADDR to the row decoder 240, and may provide a column address Y_ADDR to the column decoder 250.

For example, when performing the read operation, the control logic 230 may control selection operations with respect to the word line and the bit line of the row decoder 240 and the column decoder 250 and sensing operations of the sense amplifying unit 222, in order to read data from the selected memory cell, and may control the voltage generator 260 such that voltages provided to the row decoder 240, the column decoder 250, and the sense amplifying unit 222 have predetermined or alternatively, desired voltage levels. The voltage generator 260 may generate various types of voltages for performing the write, read, and erase operations with respect to the memory cell array 210 based on the voltage control signal CTRL_vol. For example, the voltage generator 260 may generate first driving voltages $V_R$ for driving the plurality of word lines WL and second driving voltages $V_C$ for driving the plurality of bit lines BL. For example, when performing the read operation, the voltage generator 260 may generate a first precharge voltage Vp1, a discharge voltage Vdc, and turn-on or turn-off voltages of switches of the row decoder 240 as the first driving voltages $V_R$ and may generate a second precharge voltage Vp2, a clamping voltage $V_{CMP}$, and turn-on or turn-off voltages of switches of the column decoder 250 as the second driving voltage $V_C$. In addition, the voltage generator 260 may generate various voltages to be provided to the write/read circuit 220, such as a set or reset write voltage to be provided to the write driver 221 and a reference voltage Vref to be provided to the sense amplifying unit 222.

The row decoder 240 may be connected to the memory cell array 210 through the plurality of word lines WL and may activate the selected word line among the plurality of word lines WL in response to the row address X_ADDR received from the control logic 230. For example, the row decoder 240 may control a voltage to be applied to the selected word line among the plurality of word lines WL or may control the connection relationship of the selected word line, in response to the row address X_ADDR. The row decoder 240 may include a plurality of row switches, and at least one row switch may be connected to each of the word lines WL. Through the turn-on or turn-off operation of the plurality of row switches, the selected word line may be activated for the write/read operation. In the read operation, the row decoder 240 may connect the selected word line to the sense amplifying unit 222 and may apply the discharge voltage Vdc to the unselected word line.

The column decoder 250 may be connected to the memory cell array 210 through the plurality of bit lines BL and may activate the selected bit line among the plurality of bit lines BL in response to the column address Y_ADDR received from the control logic 230. For example, the column decoder 250 may control a voltage to be applied to the selected bit line among the plurality of bit lines BL or may control the connection relationship of the selected bit line, in response to the column address Y_ADDR. The column decoder 250 may include a plurality of column switches, and at least one column switch may be connected to each of the plurality of bit lines BL. Through the turn-on or turn-off operation of the plurality of column switches, the selected bit line may be activated for the write/read operation.

Figure 3A:
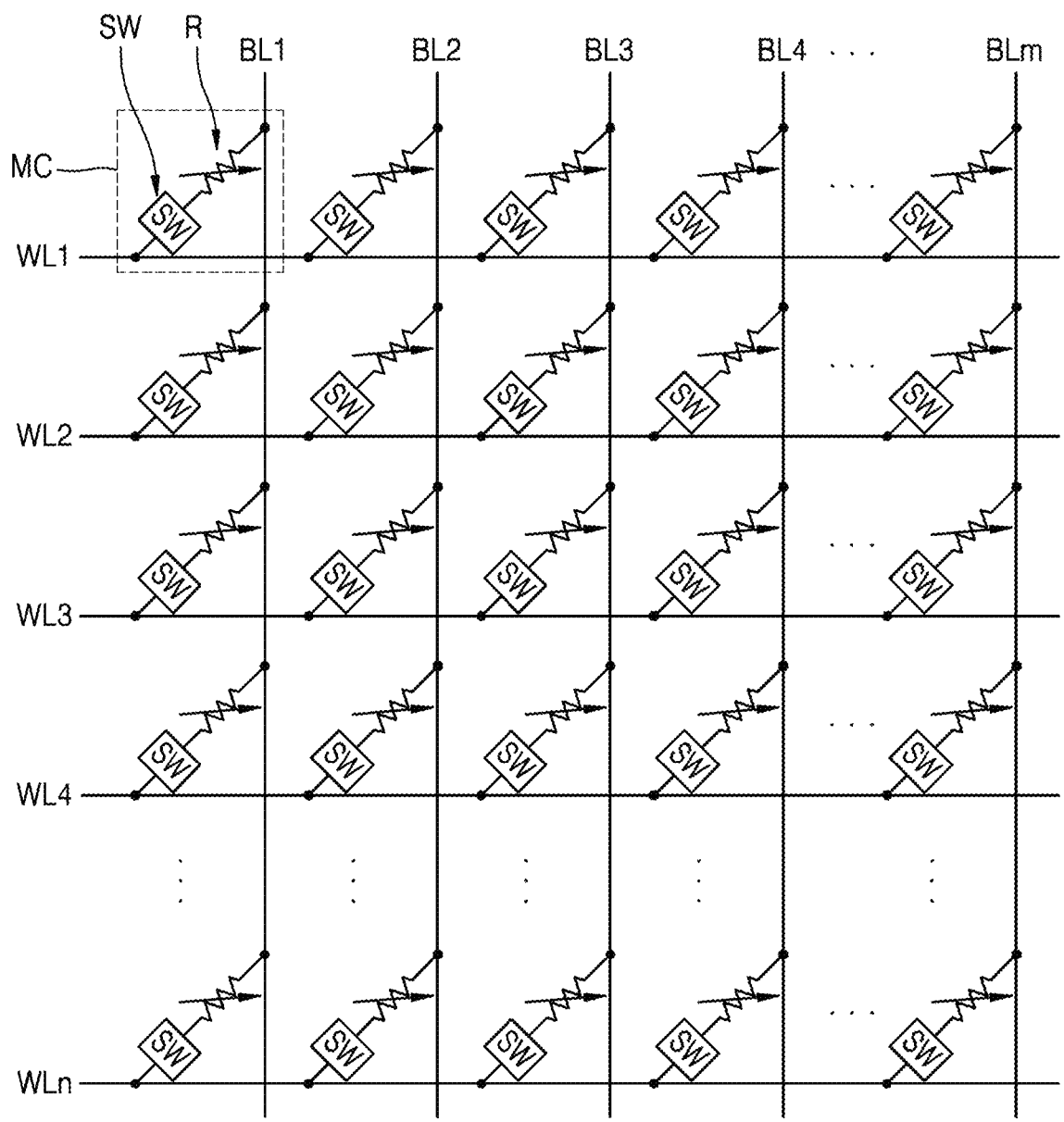
FIGS. 3A and 3B are circuit diagrams illustrating an example embodiment of a memory cell array of FIG. 2.
Figure 3B:
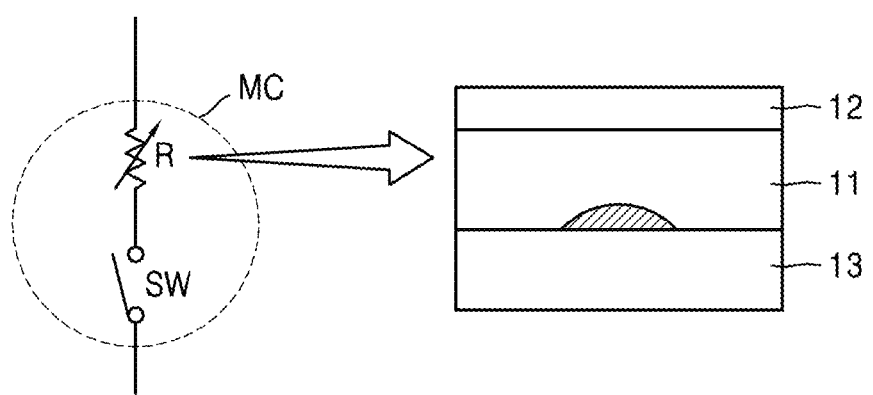

FIGS. 3A and 3B are circuit diagrams illustrating an example embodiment of a memory cell array of FIG. 2. FIGS. 3A and 3B illustrate a case where the resistive memory cell is PRAM. In addition, the memory cell array 210 illustrated in FIG. 3A may correspond to one cell block.

The memory cell array 210 may include a two-dimensional memory cell array of a horizontal structure and may include the plurality of word lines WL1 to WLn, the plurality of bit lines BL1 to BLm, and the plurality of memory cells MC. The memory cell array may include a plurality of memory blocks. Each of the memory blocks may have the plurality of memory cells arranged in rows and columns. Herein, the number of word lines WL, the number of bit lines BL, and the number of memory cells MC may vary according to embodiments. However, the inventive concepts are not limited thereto, and in other embodiments, the memory cell array 210 may include a three-dimensional memory cell array of a vertical structure.

According to some embodiments, each of the plurality of memory cells MC may include a variable resistance device R and a switching device SW. Herein, the variable resistance device R may be referred to as a variable resistance material and the switching device SW may be referred to as a selection device.

In some embodiments, the variable resistance device R may be connected between one of the plurality of bit lines BL1 to BLm and the switching device SW, and the switching device SW may be connected between the variable resistance device R and one of the plurality of word lines WL1 to WLn. However, the inventive concepts are not limited thereto, and the switching device SW may be connected between one of the plurality of bit lines BL1 to BLm and the variable resistance device R, and the variable resistance device R may be connected between the switching device SW and one of the plurality of word lines WL1 to WLn.

The switching device SW may be connected between any one of the plurality of word lines WL1 to WLn and the variable resistance device R and may control the supply of current to the variable resistance device R according to voltages applied to the connected word line and bit line. The switching device SW may be implemented with ovonic threshold switching (OTS) material. However, the switching device SW is not limited thereto, and in other embodiments, the switching device SW may be changed by another switchable device such as an unidirectional diode, a bidirectional diode, a transistor.

A voltage may be applied to the variable resistance device R of the memory cell MC through the plurality of word lines WL1 to WLn and the plurality of bit lines BL1 to BLm, so that a current may flow through the variable resistance device R. For example, the variable resistance device R may include a phase change material layer capable of reversibly changing between a first state and a second state. However, the variable resistance device R is not limited thereto and may include any variable resistor that varies in resistance value according to the applied voltage. For example, the selected memory cell MC may reversibly change the resistance of the variable resistance device R between the first state and the second state according to a voltage applied to the variable resistance device R.

According to the resistance change of the variable resistance device R, the memory cell MC may store digital information such as '0' or '1' and may also erase the digital information from the memory cell MC. For example, data may be written into a high resistance state '0' and a low resistance state '1' in the memory cell MC. Herein, a write operation from the high resistance state '0' to the low resistance state '1' may be referred to as 'set operation', and the write operation from the low resistance state '1' to the high resistance state '0' may be referred to as 'reset operation'. However, the memory cell MC according to embodiments of the inventive concepts is not limited to the digital information of the high resistance state '0' and the low resistance state '1' illustrated above, and may store various resistance states.

By selecting the plurality of word lines WL1 to WLn and the plurality of bit lines BL1 to BLm, an arbitrary memory cell MC may be addressed, and by applying a predetermined or alternatively, desired signal (for example, voltage or current) between the plurality of word lines WL1 to WLn and the plurality of bit lines BL1 to BLm, the memory cell MC may be programmed. In some embodiments, the voltage may be measured through the selected word line among the plurality of word lines WL1 to WLn, so that information according to the resistance value of the variable resistance device R of the selected memory cell MC, that is, the programmed data may be read.

Referring to FIG. 3B, the memory cell MC may include the variable resistance device R and the switching device SW, and the switching device SW may be implemented using various devices such as transistor and diode. The variable resistance device R may include a phase change film 11 (or a variable resistance layer) including germanium, antimony, and tellurium mixtures (GST, Ge—Sb—Te), an upper electrode 12 formed on the phase change film 11, and a lower electrode 13 formed under the phase change layer 11.

The upper and lower electrodes 12, 13 may include various metals, metal oxide or metal nitride. The upper and lower electrodes 12, 13 may include aluminum (Al), copper (Cu), titanium nitride (TiN), titanium aluminum nitride (TixAlyNz), iridium (Jr), platinum (Pt), silver (Ag), gold (Au), polysilicon, tungsten (W), titanium (Ti), tantalum (Ta), tantalum nitride (TaN), tungsten nitride (WN), nickel (Ni), cobalt (Co), chromium (Cr), antimony (Sb), iron (Fe), molybdenum (Mo), palladium (Pd), tin (Sn), zirconium (Zr), zinc (Zn), iridium oxide ($IrO_2$), strontium zirconate oxide (StZrO3), and the like.

The phase change film 11 may include a bipolar resistive memory material or a unipolar resistive memory material. The bipolar resistive memory material may be programmed in the set or reset states according to the polarity of current, and perovskite-based materials may be used for the bipolar resistive memory material. On the other hand, the unipolar resistive memory material may be programmed in the set or reset states even by a current of the same polarity, and a transition metal oxide such as NiOx or TiOx may be used for the unipolar resistive memory material.

A GST material may be programmed between an amorphous state with a relatively high resistivity and a crystalline state with a relatively low resistivity. The GST material may be programmed by heating the GST material. The magnitude and time of heating may determine whether the GST material remains in the amorphous or crystalline states. The high resistivity and the low resistivity may be respectively represented as a programmed value of logic 0 or logic 1 and may be sensed by measuring the resistivity of the GST material. On the contrary, the high resistivity and the low resistivity may be respectively represented as a programmed values of logic 1 or logic 0.

Figure 4A:
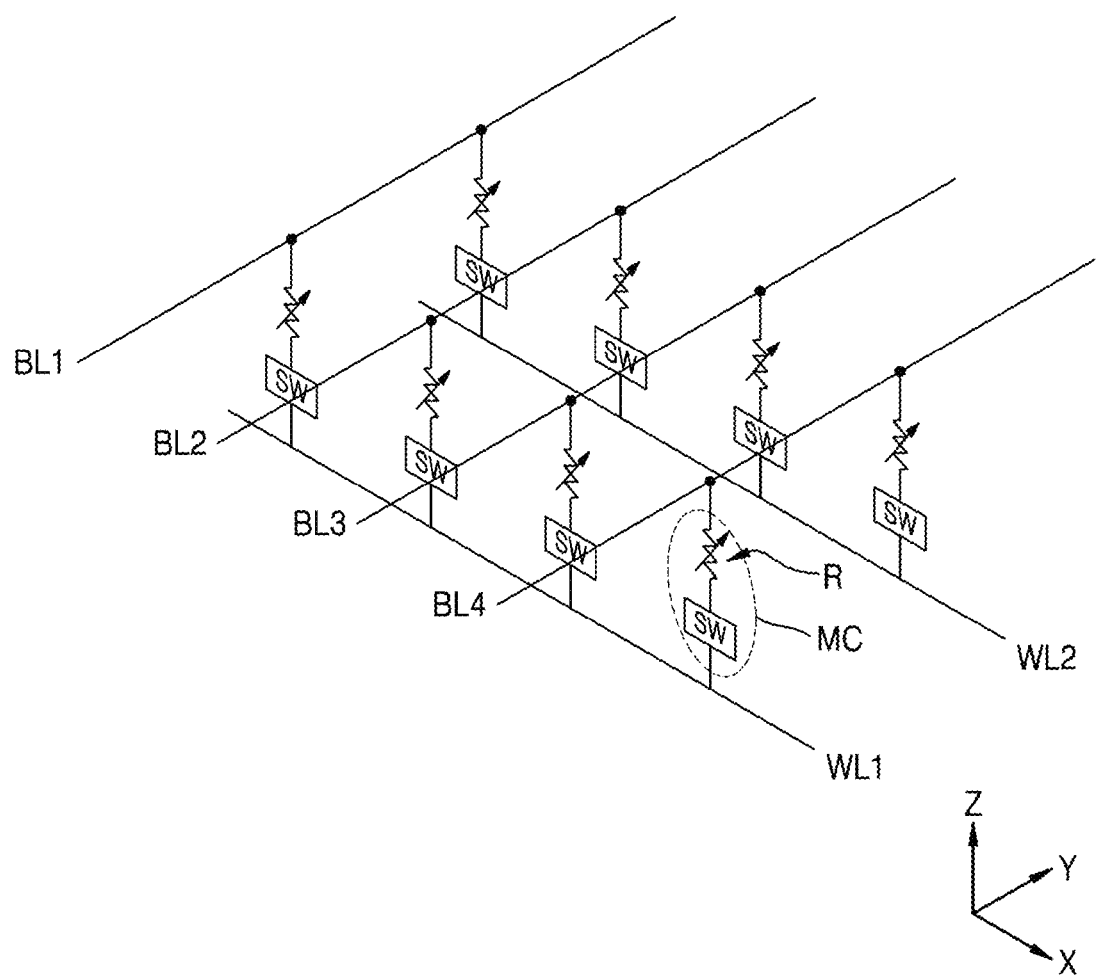
FIG. 4A is a circuit diagram illustrating an example embodiment of the memory cell array of FIG. 2.
Figure 4B:
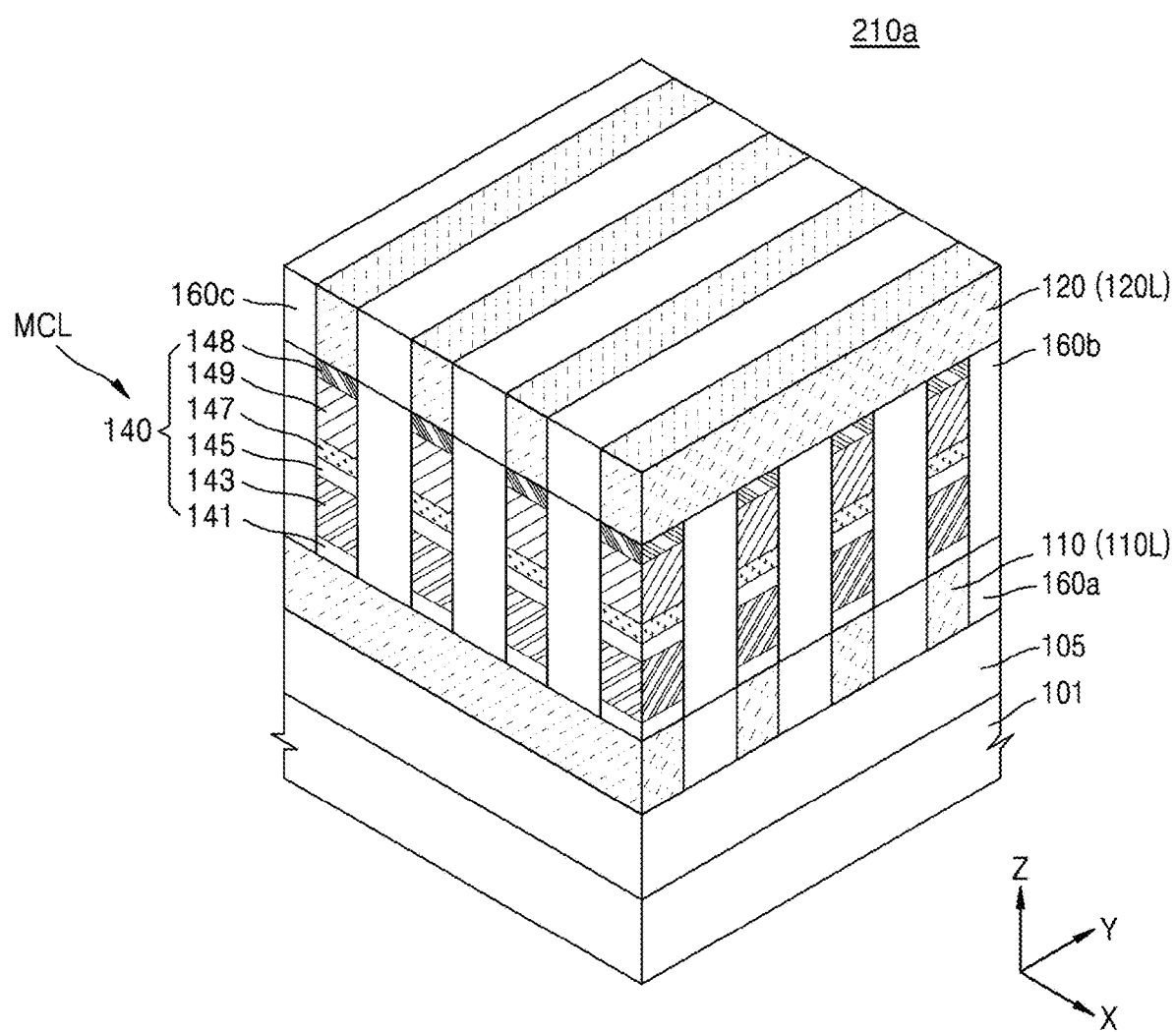
FIG. 4B is a perspective view of the memory cell array of FIG. 4A.

FIG. 4A is a circuit diagram illustrating an example embodiment of the memory cell array of FIG. 2, and FIG. 4B is a perspective view of the memory cell array of FIG. 4A.

Referring to FIG. 4A, a memory cell array 210a may include word lines WL1 and WL2, extending in a first direction (an X direction) and spaced apart from each other in a second direction (a Y direction) perpendicular to the first direction. In addition, the memory cell array 210a may include bit lines BL1, BL2, BL3, and BL4, being spaced apart from the word lines WL1 and WL2 in a third direction (a Z direction) and extending in the second direction.

The memory cells MC may be between the bit lines BL1, BL2, BL3, BL4 and the word lines WL1, WL2, respectively. For example, the memory cell MC may be disposed at an intersection of the bit lines BL1, BL2, BL3, BL4 and the word lines WL1, WL2 and may the variable resistance device R for storing information and the switching device SW for selecting the memory cell MC. The switching device SW may be referred to as a switching device layer or an access device layer.

The memory cells MC may be arranged with the same structure in the third direction. For example, in the memory cell MC disposed between the word line WL1 and the bit line BL1, the switching device SW may be electrically connected to the word line WL1, the variable resistance device R may be connected to the bit line BL1, and the variable resistance device R and the switching device SW may be connected in series.

However, the inventive concepts are not limited thereto. For example, unlike in FIG. 4A, the positions of the switching device SW and the variable resistance device R may be changed in the memory cell MC. For example, the variable resistance device R may be connected to the word line WL1 and the switching device SW may be connected to the bit line BL1 in the memory cell MC.

Referring to FIG. 4B, the memory cell array 210a may include a first electrode line layer 110L, a second electrode line layer 120L, and a memory cell layer MCL on a substrate 101.

An interlayer insulating layer 105 may be disposed on the substrate 101. The interlayer insulating layer 105 may include oxide such as silicon oxide or nitride such as silicon nitride, and may serve to electrically separate the first electrode line layer 110L from the substrate 101. In the memory cell array 210a of some embodiments, the interlayer insulating layer 105 is disposed on the substrate 101, but this is only one example. For example, in the memory cell array 210a of some embodiments, an integrated circuit layer may be disposed on the substrate 101, and the memory cells may be disposed on such an integrated circuit layer. The integrated circuit layer may include, for example, a peripheral circuit for the operation of the memory cells and/or a core circuit for the calculation, and the like. For reference, a structure in which the integrated circuit layer including the peripheral circuit and/or the core circuit is disposed on the substrate and the memory cells are disposed on the integrated circuit layer may be called a cell on peri (COP) structure.

The first electrode line layer 110L may include a plurality of first electrode lines 110 extending in parallel to each other in the first direction (the X direction). The second electrode line layer 120L may include a plurality of second electrode lines 120 extending in parallel to each other in the second direction (the Y direction) intersecting the first direction. The first direction and the second direction may perpendicularly intersect each other.

The first electrode lines 110 (or referred to as the lower electrodes) may correspond to the word lines WL in FIG. 4A, and the second electrode lines 120 (or referred to as the upper electrodes) may correspond to the bit lines BL in FIG.

4A. In addition, the first electrode lines 110 may correspond to the bit lines and the second electrode lines 120 may correspond to the word lines.

The memory cell layer MCL may include the plurality of memory cells 140 MC in FIG. 4A spaced apart from each other in the first and second directions. As illustrated, the first electrode lines 110 and the second electrode lines 120 may intersect each other. The memory cells 140 may be disposed at portions where the first electrode lines 110 and the second electrode lines 120 intersect between the first electrode line layer 110L and the second electrode line layer 120L.

Each of the memory cells 140 may include a lower electrode layer 141, a selection device layer 143, an intermediate electrode layer 145, a heating electrode layer 147, a variable resistance layer 149, and/or an upper electrode layer 148. When not considering the positional relationship, the lower electrode layer 141 may be referred to as a first electrode layer, the intermediate electrode layer 145 and the heating electrode layer 147 may be referred to as a second electrode layer, and the upper electrode layer 148 may be referred to as a third electrode layer.

In some embodiments, the variable resistive layer 149 (the variable resistive device R in FIG. 4A) may include a phase change material that may be reversibly changed between the amorphous state and the crystalline state according to the heating time. For example, the variable resistance layer 149 may include a material that may be reversibly changed in phase by Joule heat generated by the voltage applied to both ends of the variable resistance layer 149 and may be varied in resistance according to the change of phase. For example, the phase change material may be in a high resistance state in the amorphous phase and in a low resistance state in the crystalline phase. By defining the high resistance state as '0' and the low resistance state as '1', data may be stored in the variable resistance layer 149.

In some embodiments, the variable resistance layer 149 may include a chalcogenide material as the phase change material. For example, the variable resistance layer 149 may include Ge—Sb—Te (GST). For example, Ge—Sb—Te may include a material such as $Ge_2Sb_2Te_5$, $Ge_2Sb_2Te_7$, $Ge_1Sb_2Te_4$, or $Ge_1Sb_4Te_7$. The variable resistance layer 149 may include various phase change materials. However, the inventive concepts are not limited thereto, and the variable resistance layer 149 may include various materials having resistance change characteristics.

The selection device layer 143 (SW in FIG. 3A) may be a current adjustment layer capable of controlling the flow of current. The selection device layer 143 may include a material layer whose resistance may vary according to the magnitude of the voltage applied to both ends of the selection device layer 143. For example, the selection device layer 143 may include an ovonic threshold switching (OTS) material. When a voltage less than a threshold voltage Vt is applied to the selection device layer 143, the selection device layer 143 may maintain the high resistance state in which almost no current flows and when a voltage greater than the threshold voltage Vt is applied to the selection device layer 143, the selection device layer 143 may become the low resistance state in which current begins to flow. In addition, when the current flowing through the selection device layer 143 becomes less than a holding current, the selection device layer 143 may be changed to the high resistance state. In some embodiments, the selection device layer 143 may include a chalcogenide switching material as the OTS material.

The heating electrode layer 147 may be disposed to contact the variable resistance layer 149 between the intermediate electrode layer 145 and the variable resistance layer 149. The heating electrode layer 147 may function to heat the variable resistance layer 149 in the set or reset operation. The heating electrode layer 147 may include a conductive material capable of generating sufficient heat to phase change the variable resistance layer 149 without reacting with the variable resistance layer 149. For example, the heating electrode layer 147 may include a carbon-based conductive material.

The lower electrode layer 141, the middle electrode layer 145, and the upper electrode layer 148 may include the conductive material functioning as a current path. For example, the lower electrode layer 141, the intermediate electrode layer 145, and the upper electrode layer 148 may respectively include metal, conductive metal nitride, conductive metal oxide, or combinations thereof. In some embodiments, the lower electrode layer 141 and the upper electrode layer 148 may be selectively formed. In other words, the lower electrode layer 141 and the upper electrode layer 148 may be omitted.

A first insulating layer 160a may be between the first electrode lines 110 and a second insulating layer 160b may be between the memory cells 140 of the memory cell layer MCL. In addition, a third insulating layer 160c may be between the second electrode lines 120. The first to third insulating layers 160a to 160c may include an insulating layer of the same material or at least one of the first to third insulating layers 160a to 160c may include an insulating layer of the different material. The first to third insulating layers 160a to 160c may include, for example, a dielectric material of oxide or nitride and may function to electrically separate devices of each layer. An air gap (not shown) may be formed in place of the second insulating layer 160b. When the air gap is formed, an insulating liner (not shown) having a predetermined or alternatively, desired thickness may be formed between the air gap and the memory cells 140.

Figure 5A:
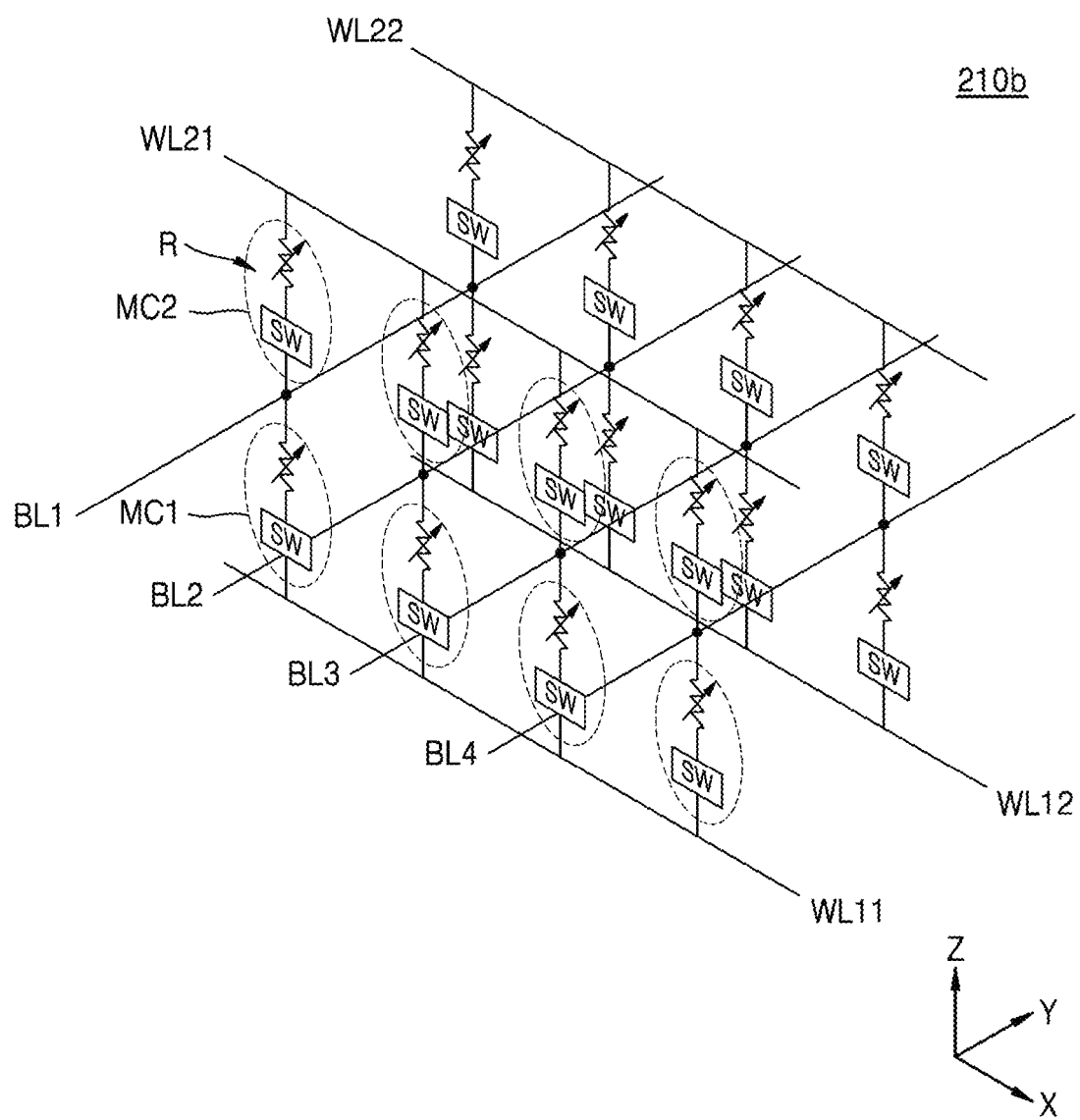
FIG. 5A is a circuit diagram illustrating an example embodiment of the memory cell array of FIG. 2.
Figure 5B:
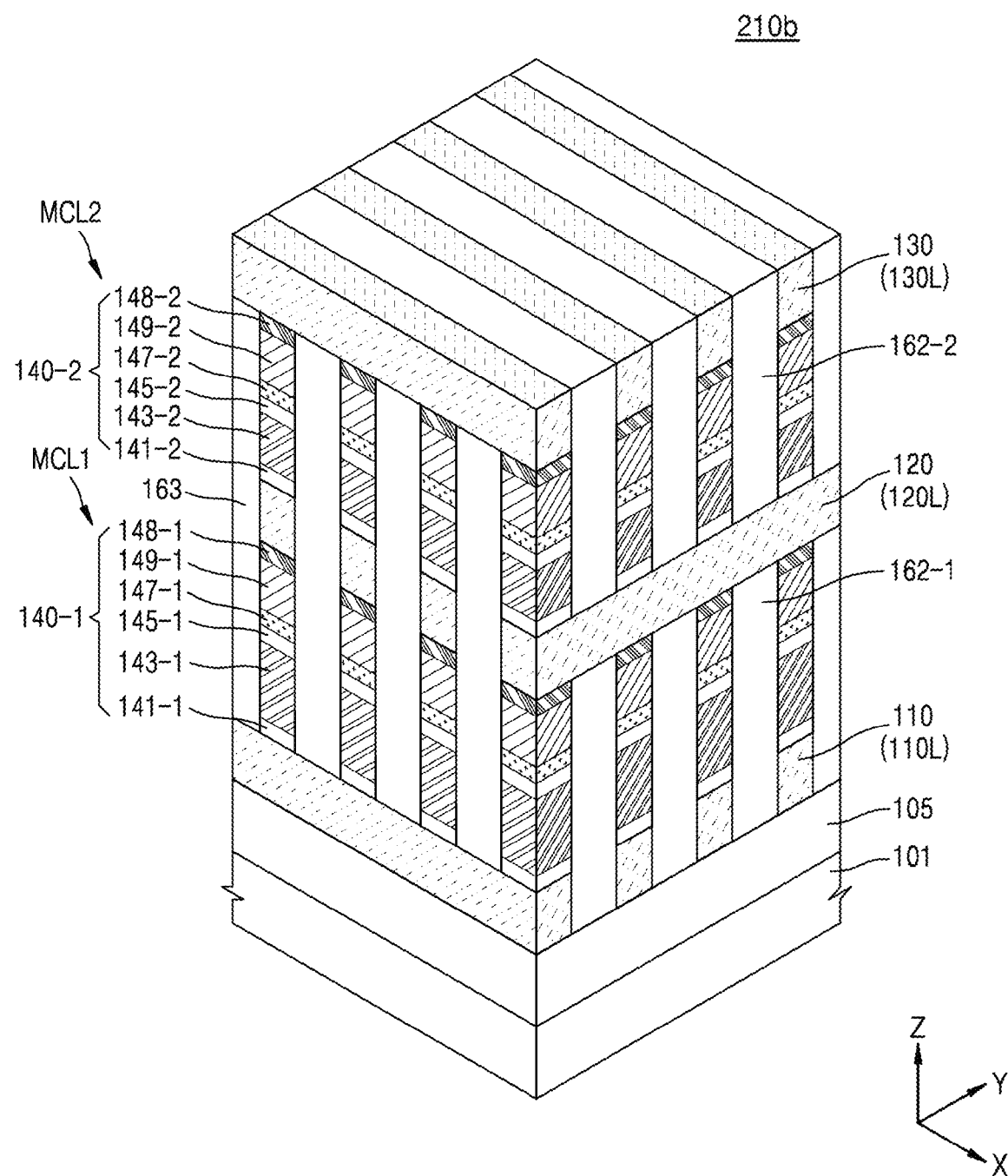
FIG. 5B is a perspective view of the memory cell array of FIG. 5A.

FIG. 5A is a circuit diagram illustrating an example embodiment of the memory cell array of FIG. 2, and FIG. 5B is a perspective view of the memory cell array of FIG. 5A.

Referring to FIG. 5A, a memory cell array 210b may include a first layer and a second layer stacked vertically, and the first layer and the second layer may share signal lines, for example, common bit lines BL1, BL2, BL3, and BL4 of FIG. 5A.

The memory cell array 210b may include lower word lines WL11 and WL12 extending in the first direction (the X direction) and spaced apart from each other in the second direction (the Y direction) perpendicular to the first direction and upper word lines WL21 and WL22 extending in the first direction (the X direction) and spaced apart from each other in the third direction (the Z direction) perpendicular to the first direction over the word lines WL11 and WL12. In addition, the memory cell array 210b may include common bit lines BL1, BL2, BL3, and BL4, spaced apart from each of the upper word lines WL21 and WL22 and the lower word lines WL11 and WL12 in the third direction and extending in the second direction.

First and second memory cells MC1 and MC2 may be located between the common bit lines BL1, BL2, BL3 and BL4 and the lower word lines WL11 and WL12 and between the common bit lines BL1, BL2, BL3 and BL4 and the upper word lines WL21 and WL22, respectively. For example, the first memory cell MC1 may be disposed at the intersection of the common bit lines BL1, BL2, BL3, and BL4 and the lower word lines WL11 and WL12 and the second memory cell MC2 may be disposed at the intersection of the common bit lines BL1, BL2, BL3, and BL4 and the upper word lines WL21 and WL22. The lower word lines WL11 and WL12, the plurality of first memory cells MC1, and the common bit lines BL1, BL2, BL3, and BL4 may constitute the first layer, and the upper word lines WL21 and WL22 and the plurality of second memory cells MC2, and the common bit lines BL1, BL2, BL3, and BL4 may constitute the second layer. By selecting the word lines WL11, WL12, WL21, and WL22 and the common bit lines BL1, BL2, BL3, and BL4, arbitrary memory cells MC1 and MC2 may be addressed.

In FIG. 5A, the memory cell array 210*b* is illustrated as including a first layer and a second layer, but is not limited thereto. The memory cell array 210*b* may include three or more layers stacked vertically.

Referring to FIG. 5B, the memory cell array 210*b* may include the first electrode line layer 110L, a first memory cell layer MCL1, the second electrode line layer 120L, a second memory cell layer MC2, and/or a third electrode line layer 130L on the substrate 101. The interlayer insulating layer 105 may be disposed on the substrate 101.

The first memory cell layer MCL1 may include a plurality of first memory cells 140-1 (MC1 in FIG. 5A) spaced apart from each other in the first direction and the second direction. The second memory cell layer MCL2 may include a plurality of second memory cells 140-2 (MC2 in FIG. 5A) spaced apart from each other in the first direction and the second direction. As illustrated, the first electrode lines 110 and the second electrode lines 120 may cross each other, and the second electrode lines 120 and the third electrode lines 130 may cross each other. The first electrode lines 110 may correspond to the word lines WL11 and WL12 in FIG. 5A, and the second electrode lines 120 may correspond to the bit lines BL1 to BL4 in FIG. 5B shared between the first layer and the second layer. In addition, the third electrode lines 130 may correspond to the word lines WL21 and WL22 in FIG. 5A.

The first memory cells 140-1 may be disposed at portions where the first electrode lines 110 and the second electrode lines 120 intersect between the first electrode line layer 110L and the second electrode line layer 120L. The second memory cells 140-2 may be disposed at portions where the second electrode lines 120 and the third electrode lines 130 intersect between the second electrode line layer 120L and the third electrode line layer 130L.

The first memory cells 140-1 and the second memory cells 140-2 may respectively include the lower electrode layers 141-1 and 141-2, the selection device layers 143-1 and 143-2, the intermediate electrode layer 145-1 and 145-2, the heating electrode layers 147-1 and 147-2, and the variable resistance layers 149-1 and 149-2. The memory cells 140 of FIG. 4B described with reference to FIG. 4B may be applied to the first memory cells 140-1 and/or the second memory cells 140-2. In some embodiments, a structure of the first memory cells 140-1 may be the same or substantially the same as that of the second memory cells 140-2.

Figure 6A:
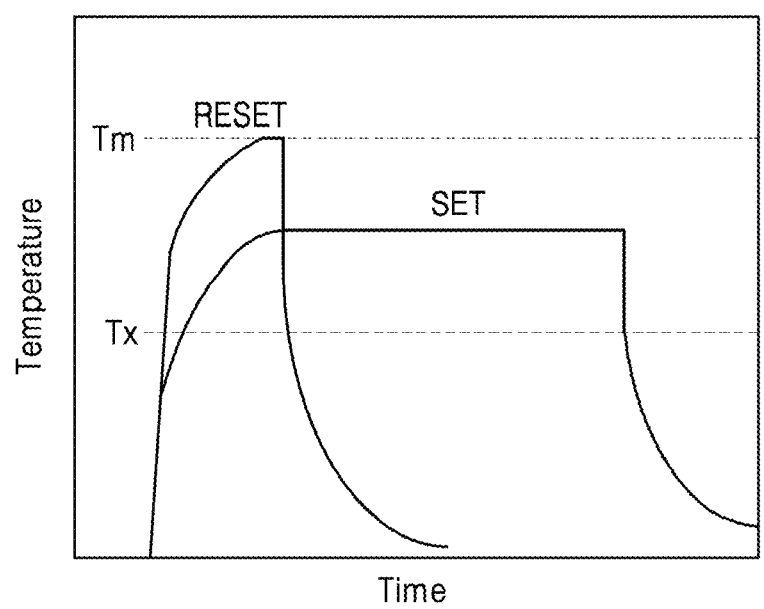
FIG. 6A is a graph illustrating set and reset writes with respect to a variable resistance device of a memory cell of FIG. 3A.
Figure 6B:
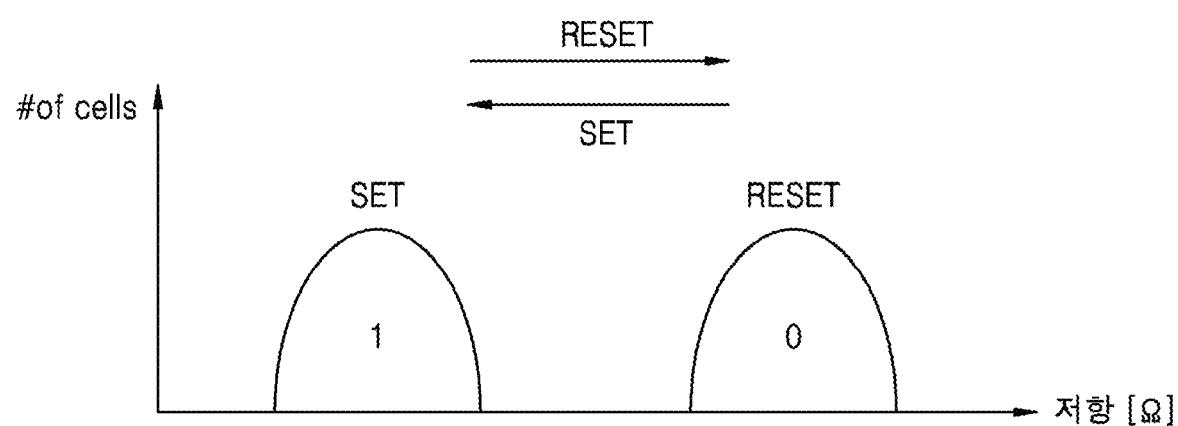
FIG. 6B is a graph illustrating distribution of memory cells according to resistance when the memory cell is a single level cell.

FIG. 6A is a graph illustrating set and reset writes with respect to the variable resistance device of the memory cell of FIG. 3A, and FIG. 6B is a graph illustrating distribution of memory cells according to resistance when the memory cell is a single level cell.

Referring to FIG. 6A, when the phase change material constituting the variable resistance device R of FIG. 3A is heated for a certain time to a temperature between a crystallization temperature (Tx) and a melting point (Tm) and gradually cooled, the phase change material may be in the crystalline state. This crystalline state may be referred to as a 'set state' and may be a state where data '0' may be stored. On the other hand, if the phase change material is quenched after heating to a temperature above the melting point (Tm), the phase change material may be in the amorphous state. This amorphous state may be referred to as a 'reset state' and may be a state where data '1' may be stored. Therefore, data may be stored by supplying the current to the variable resistance device R, and data may be read by measuring the resistance value of the variable resistance device R.

Referring to FIG. 6B, the horizontal axis represents resistance, and the vertical axis represents the number of memory cells MC. When the memory cell MC is the single level cell, the memory cell MC may be one of the low resistance state, that is, the set state SET and the high resistance state, that is, the reset state RESET.

Accordingly, the operation of switching the memory cell MC from the low resistance state to the high resistance state may be referred to as a reset operation or a reset write operation. In some embodiments, data '1' may be written in the memory cell MC by the reset write operation. In addition, the operation of switching the memory cell MC from the high resistance state to the low resistance state may be referred to as a set operation or a set write operation. In some embodiments, data '0' may be written in the memory cell MC by the set write operation.

Figure 7:
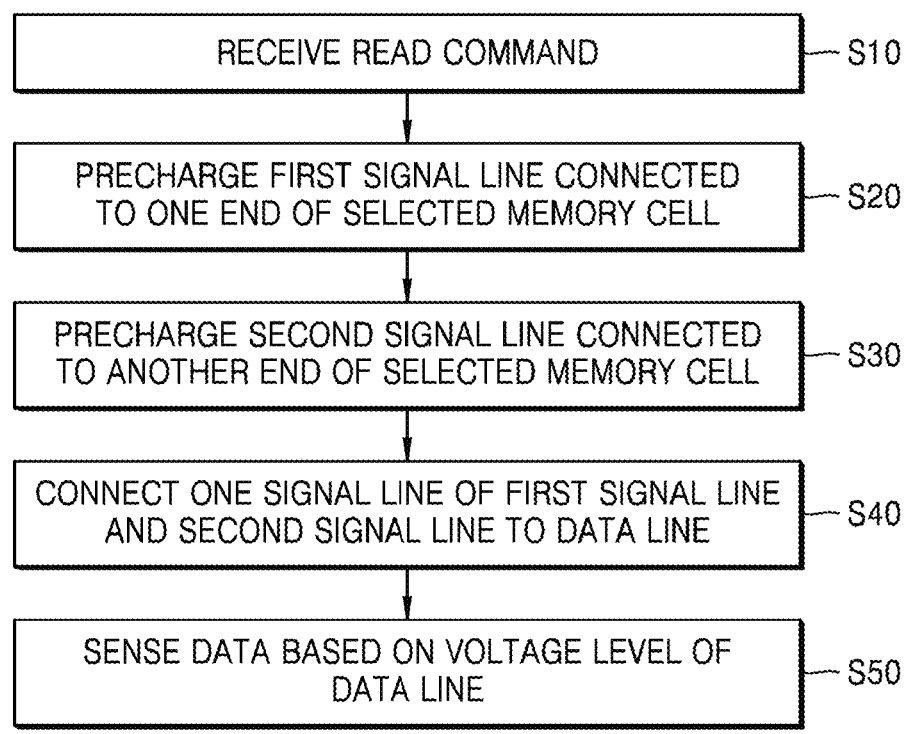
FIG. 7 is a flowchart illustrating a reading method of a memory device according to an example embodiment of the inventive concepts.

FIG. 7 is a flowchart illustrating a reading method of a memory device according to an example embodiment of the inventive concepts.

Referring to FIG. 7, a memory device may perform a data read operation according to a request from an external host. For example, a memory controller included in a memory system may provide a read command to the memory device according to the request from the host. The memory device may receive the read command (S10) and may decode an address provided with the read command to determine the selected memory cell.

The memory device may precharge the first signal line connected to one end of the selected memory cell (S20). For example, the first signal line may be the word line and the first precharge voltage may be applied to the word line. However, the inventive concepts are not limited thereto, and the first signal line may be the bit line.

In operation S20, a first selection switch connected to the first signal line, for example, a first selection transistor, may be turned on to connect the first signal line to the data line, and the first signal line and the data line may be precharged through a precharge path connected to the data line.

The memory device may precharge a second signal line connected to another end of the selected memory cell (S30). For example, the second signal line may be the bit line, and the second precharge voltage may be applied to the bit line. However, the inventive concepts are not limited thereto, and when the first signal line is the bit line, the second signal line may be the word line.

The second precharge voltage may be higher than the first precharge voltage, and the voltage difference between the first precharge voltage and the second precharge voltage may be greater than a threshold voltage of the memory cell, for example, the threshold voltage of the switching device. Accordingly, a current (hereinafter referred to as a cell current) may flow through the memory cell and the cell current may charge the first signal line, whereby the voltage level of the first signal line may be increased. In some embodiments, since the amount of the cell current may be different depending on the state of the memory cell, for example, the set state or the reset state, the voltage level of the first signal line may be changed according to the state of the memory cell. For example, when the memory cell is in the set state, since the resistance value of the memory cell is small and the current amount of the cell current is large, the voltage level of the first signal line may be relatively increased. On the other hand, when the memory cell is in the reset state, since the resistance value of the memory cell is large and the current amount of the cell current is small, the voltage level of the first signal line may increase relatively little or may not increase.

The memory device may connect one signal line of the first signal line and the second signal line to the data line (S40). For example, the memory device may connect the first signal line to the data line. By connecting the first signal line to the data line, charge sharing may be performed between the first signal line and the data line, and the voltage levels of the first signal line and the data line may be the same. Therefore, when the memory cell is in the set state, the voltage level of the data line may be high and when the memory cell is in the reset state, the voltage level of the data line may be low.

The memory device may sense data, that is, data stored in the memory device, based on the voltage level of the data line (S50). The memory device may compare the voltage level of the data line to the reference voltage and may output the result of comparison as data. In some embodiments, the reference voltage may be set to an intermediate level between the voltage level of the data line when the memory cell is in the set state and the voltage level of the data line when the memory cell is in the reset state. Thus, by comparing the voltage level of the data line to the reference voltage, the result of comparison may be output as 1-bit of data, for example 0 or 1. However, the inventive concepts are not limited thereto, and when the memory cell is a multi-level cell, the memory cell may have a plurality of states. In operation S50, the voltage level of the data line may be determined according to the plurality of states of the memory cell. The memory device may read data of multi-bit by comparing the voltage level of the data line to a plurality of reference voltages.

In some embodiments, in operation S30, the first selection switch connected to the first signal line may be weakly turned on in at least a portion of the period in which the second signal line is precharged. For example, the first signal line is the word line, the second signal line is the bit line, and the word line selection transistor connected to the word line may be weakly turned on in the precharge period of the bit line such that leakage current flows. The word line may be pseudo floated. Accordingly, the current flowing through the memory cell may charge the data line, thereby increasing the voltage level of the data line. Accordingly, in operation S40, when the first signal line and the data line are connected, the amount of change in the voltage level of the first signal line may be reduced, thereby increasing the sensing margin. This will be described in detail with reference to FIGS. 8 to 14.

In some embodiments, in operation S30, at least a portion of the first signal line, that is, the unselected first signal lines adjacent to the selected first signal line, may be floated in the period where the second signal line is precharged. Accordingly, the parasitic capacitor component of the first signal line may be reduced, so that the amount of current of the cell current may be reduced, thereby reducing the read disturb.

In some embodiments, in the memory cell array of the three-dimensional cross point structure, when the parasitic capacitor value of the first signal line of the second layer is greater than the parasitic capacitor value of the first signal line of the first layer, the number of unselected first signal lines that may be floated in operation S30 when the read operation is performed with respect to the memory cell of the second layer may be more than the number of unselected first signal lines that may be floated in operation S30 when the read operation is performed with respect to the memory cell of the first layer. Accordingly, the difference in the parasitic capacitor values of the first signal lines of the first layer and the second layer may be compensated for, thereby reducing the influence on the read disturb characteristic. This will be described later in detail with reference to FIGS. 16 to 18.

Figure 8:
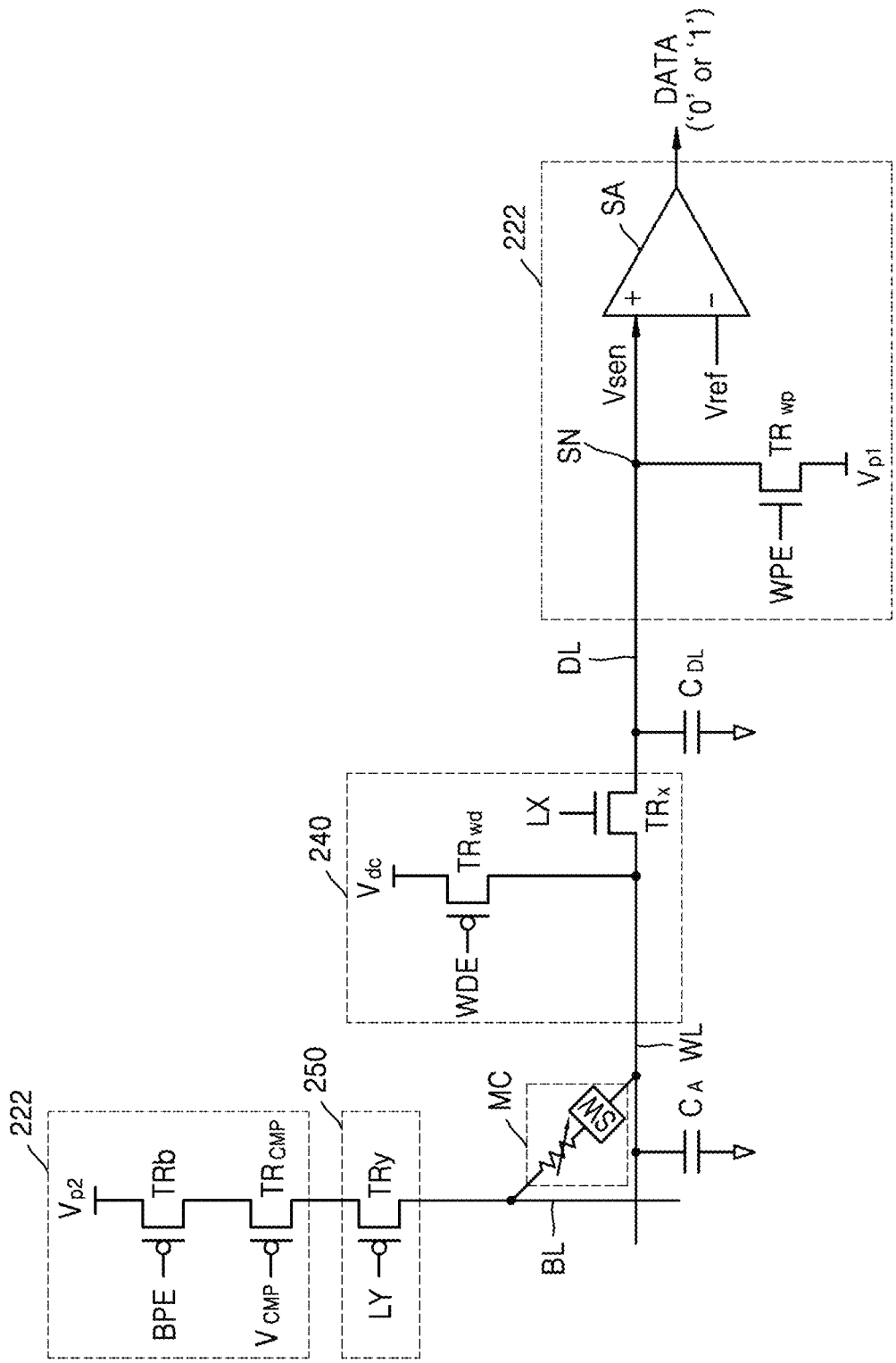
FIG. 8 is a circuit diagram illustrating components for performing a read operation of a memory device according to an example embodiment of the inventive concepts.

FIG. 8 is a circuit diagram illustrating components for performing a read operation of a memory device according to an example embodiment of the inventive concepts.

Referring to FIG. 8, the word line WL may be connected to one end of the memory cell MC and the bit line BL may be connected to another end of the memory cell MC. The row decoder 240 may be connected to the word line WL. For example, the row decoder 240 may include a plurality of row switches, for example, the word line selection transistor TRx and a discharge transistor TRwd. For convenience of description, FIG. 8 illustrate that the row decoder 240 includes one word line selection transistor TRx and one discharge transistor TRwd, but the row decoder 240 may include a plurality of word line selection transistors TRx and a plurality of discharge transistors TRwd respectively connected to the plurality of word lines. In addition, the row decoder 240 may further include other switches and/or control devices.

The word line selection transistor TRx may be turned on or turned off in response to the word line selection signal LX. When the word line selection transistor TRx is turned on, the word line WL may be connected to a sense amplifying unit 222 through the data line DL (or a global word line). When the word line selection transistor TRx is implemented as an NMOS transistor, the word line selection transistor TRx may be turned on when the word line selection signal LX is at a high level and may be turned off when the word line selection signal LX is at a low level.

The discharge transistor TRwd may be turned on or turned off in response to a discharge enable signal WDE. When the discharge transistor TRwd is turned on, a discharge voltage Vdc (or referred to as a first inhibit voltage) may be applied to the word line WL. For example, the discharge voltage Vdc may be 0V (volt). When the discharge transistor TRwd is implemented as a PMOS transistor, the discharge transistor TRwd may be turned on when the discharge enable signal WDE is at the low level, and may be turned off when the discharge enable signal WDE is at the high level.

For example, in the read operation, when the word line selection transistor TRx connected to the selected word line is turned on, the discharge transistor TRwd connected to the selected word line may be turned off. The discharge transistors TRwd connected to the unselected word lines may be turned on, and the selection transistors TRx connected to the unselected word lines may be turned off.

The column decoder 250 may be connected to the bit line BL. For example, the column decoder 250 may include a plurality of column switches, for example, bit line selection transistors TRy. For the convenience of description, FIG. 8 illustrates that the column decoder 250 includes one bit line selection transistor TRy, but the column decoder 250 may include a plurality of bit line selection transistors TRy respectively connected to the plurality of bit lines BL. In addition, the column decoder 250 may further include a plurality of discharge transistors connected to each of the plurality of bit lines BL.

The bit line selection transistor TRy may be connected to control switches, for example, a clamping transistor $TR_{CMP}$ and a bit line precharge transistor TRb. The bit line precharge transistor TRb and the clamping transistor $TR_{CMP}$ may be understood as components of the sense amplifying unit 222.

The bit line selection transistor TRy may be turned on or turned off in response to the bit line selection signal LY. For example, as shown, when the bit line selection transistor TRy is implemented as a PMOS transistor, the bit line selection transistor TRy may be turned on when the bit line selection signal LY is at the low level and may be turned off when the bit line selection signal LY is at the high level.

The bit line precharge transistor TRb may be turned on or off in response to the bit line precharge enable signal BPE, and, for example, when the bit line precharge transistor TRb is implemented as a PMOS, the bit line precharge transistor TRb may be turned on when the bit line precharge enable signal BPE is at the low level, and the bit line precharge transistor TRb may be turned off when the bit line precharge enable signal BPE is at the high level. The bit line precharge transistor TRb may be turned on to apply the second precharge voltage Vp2 to the bit line. In some embodiments, the clamping transistor $TR_{CMP}$ may be controlled to apply a predetermined or alternatively, desired voltage to the bit line BL based on the clamping voltage $V_{CMP}$.

The sense amplifying unit 222 may include a word line precharge transistor $TR_{WP}$ and a sense amplifier SA. The sense amplifying unit 222 may further include the bit line precharge transistor TRb and the clamping transistor $TR_{CMP}$.

The word line precharge transistor $TR_{WP}$ may be turned on or turned off in response to the word line precharge enable signal WPE. When the wordline precharge transistor $TR_{WP}$ is implemented as an NMOS, the word line precharge transistor $TR_{WP}$ may be turned on when the word line precharge enable signal WPE is at the high level, and the word line precharge transistor $TR_{WP}$ may be turned off when the word line precharge enable signal WPE is at the low level. The word line selection transistor TRx and the word line precharge transistor $TR_{WP}$ may be turned on to apply the first precharge voltage Vp1 to the word line WL.

The word line WL and the bit line BL may respectively include the parasitic capacitor component, and the parasitic capacitor component of the word line WL, for example, the word line capacitor $C_A$ component, may be less than the parasitic capacitor component (not shown) of the bit lines BL. Accordingly, the sense amplifier SA may be connected to the word line in which the influence by the parasitic capacitor component is relatively low, and may sense the voltage level of the word line, thereby reading data of the selected memory cell.

The sense amplifier SA may compare a sensing voltage Vsen of the sensing node SN, for example, a voltage level of the data line DL (at this time, the voltage level of the data line DL is the same as the voltage level of the word line WL) with the reference voltage Vref, and then may output the comparison result as data DATA. In other words, the sense amplifier SA may act as a comparator. For example, when the memory cell MC is in the set state, the sensing voltage Vsen may be higher than the reference voltage Vref, and the sense amplifier SA may output '1' as data DATA. For example, when the memory cell MC is in the reset state, the sensing voltage Vsen may be lower than the reference voltage Vref, and the sense amplifier SA may output '0' as data DATA.

As described above with reference to FIGS. 5A and 5B, in the memory cell array having a three-dimensional cross point structure, when the first layer and the second layer which are vertically stacked share the bit line, the word line capacitor $C_A$ of the first layer may be smaller than the word line capacitor $C_A$ of the second layer. In other words, the word line capacitance of the first layer may be smaller than the word line capacitance of the second layer. When the word line capacitor $C_A$ is small, the sensing margin of the sense amplifier SA may be reduced. On the other hand, when the word line capacitor $C_A$ is large, the read disturb characteristics may be degraded. As described above, the word line capacitor $C_A$ may affect the sensing margin and the read disturb characteristics. As the word line capacitors $C_A$ of the first and second layers may be different from each other, the sensing margin between the first layer and the second layer and the read disturb characteristics may be different.

However, according to the reading method according to the example embodiments of the inventive concepts described with reference to FIG. 7, by weakly turning on the word line selection transistor TRx in the period in which the bit line BL is precharged, the lowering of the sensing margin may be compensated for without increasing the capacitance of the capacitor word line $C_A$, and in addition, the capacitance difference between the first layer and the second layer may be compensated for. In addition, when the word line capacitor $C_A$ component of the second layer is greater than the word line capacitor $C_A$ component of the first layer, at least a portion of the unselected word line WL adjacent to the word line WL may be floated in a period in which the bit line BL may be precharged when the read operation is performed on the memory cell of the second layer, and the unselected word line WL adjacent to the word line WL may be biased with the discharge voltage Vdc in a period in which the bit line BL may be precharged when the read operation is performed on the memory cell of the first layer or a fewer unselected word lines WL than those in the second layer may be floated, and therefore, the difference of capacitances of the first layer and the second layer may be compensated.

Figure 9:
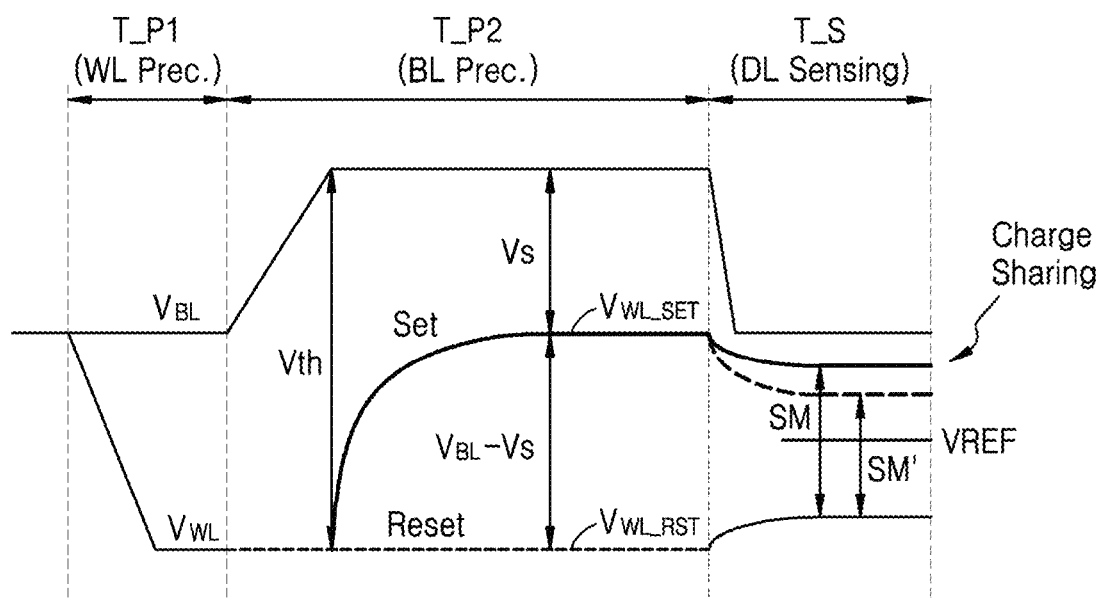
FIG. 9 is a graph illustrating a reading method of a memory device according to an example embodiment of the inventive concepts.
Figure 10:
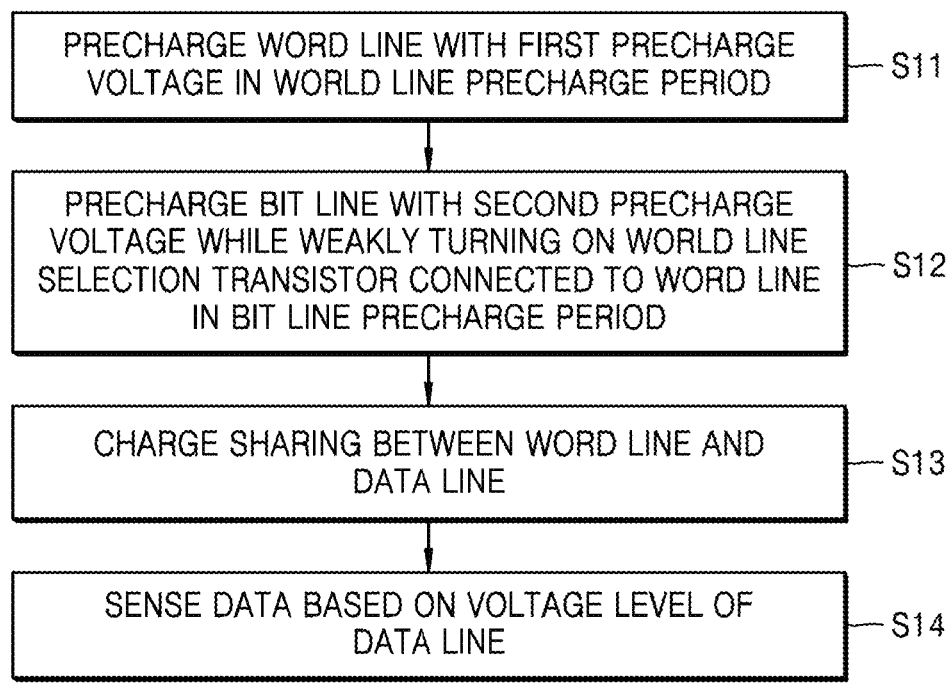
FIG. 10 is a flowchart illustrating a reading method of a memory device according to an example embodiment of the inventive concepts.

FIG. 9 is a graph illustrating a reading method of a memory device according to an example embodiment of the inventive concepts, and FIG. 10 is a flowchart illustrating a method of reading a memory device according to an example embodiment of the inventive concepts. The reading method of the memory device of FIGS. 9 and 10 may be performed according to operations of components of the memory device of FIG. 8. Therefore, it will be described with reference to FIG. 8 together.

Referring to FIG. 9, the horizontal axis represents time and the vertical axis represents voltage levels of the bit line and the word line. The word line WL may be precharged with a first precharge voltage in a first precharge period T_P1, for example, a word line precharge period (S11). The word line selection transistor TRx and the word line precharge transistor $TR_{WP}$ may be turned on to precharge the word line WL and the data line DL with the first precharge voltage Vp1. In some embodiments, the first precharge voltage Vp1 may be a negative voltage, and the voltage level of the word line WL may drop to the first precharge voltage Vp1.

At this time, the bit line selection transistor TRy may be turned off, so that the bit line BL may be in a floating state.

When the memory cell MC is the selected memory cell, the discharge transistor TRwd may maintain a turn-off state in the read operation.

The bit line BL may be precharged with the second precharge voltage while weakly turning on the word line selection transistor TRx connected to the word line WL in the second precharge period T_P2, for example, the bit line precharge period (S12). The bit line selection transistor TRy and the bit line precharge transistor TRb may be turned on in the second precharge period T_P2 to apply the second precharge voltage Vp2 to the bit line BL. In some embodiments, a power supply voltage may be applied through the bit line precharge transistor TRb, and the clamping transistor $TR_{CMP}$ may maintain the voltage level $V_{BL}$ of the bit line BL as the second precharge voltage Vp2.

The voltage $V_{BL}$ of the bit line BL may be increased to the second precharge voltage Vp2. At this time, when the difference between the voltage level $V_{BL}$ of the bit line BL and the voltage level $V_{WL}$ of the word line WL is equal to or greater than the threshold voltage Vth of the memory cell MC, the cell current may flow in the memory cell MC. When the memory cell MC is in the set state, the voltage level $V_{WL\_SET}$ of the word line WL may increase. However, the difference between the voltage level $V_{WL\_SET}$ of the word line WL and the voltage level $V_{BL}$ of the bit line VL may be equal to or greater than an inhibit voltage Vs, that is, the voltage level at which the cell current of the memory cell may be cut off. Therefore, when the memory cell MC is in the set state, the voltage level $V_{WL\_SET}$ of the word line WL may be maximally increased to a voltage level in which a cut-off voltage Vs is reduced from the voltage level VBL of the bit line BL. On the other hand, when the memory cell MC is in the reset state, the voltage level VWL_RST of the word line WL may not increase almost or may increase very little.

Since the word line selection transistor TRx is weakly turned on in the second precharge period T_P2, the word line WL may be pseudo-floated. As described above, the word line selection transistor TRx may be turned on when the word line selection signal LX is at the high level, and the word line selection transistor TRx may be turned off when the word line selection signal LX is at the low level. In the second precharge period T_P2, a weak-on signal (a weak-on voltage) that is lower than the high level and higher than the low level may be provided to the word line selection transistor TRx as the word line selection signal LX. In an example embodiment, the weak-on signal may be a voltage having a level lowered from the high level by the threshold voltage of the word line selection transistor TRx.

In the sensing period T_S, the word line selection transistor TRx may be turned on so that the word line WL and the data line DL are connected to perform charge sharing (S13). Due to charge sharing, the voltage levels of the word line WL and the data line DL may be the same, and as shown in FIG. 9, the voltage levels $V_{WL\_SET}$ and $V_{WL\_RST}$ of the word line WL may vary. When charge sharing is completed, data may be sensed based on the voltage level of the data line DL, for example, the sensing voltage Vsen (S14). The sense amplifier SA may sense data by comparing the reference voltage Vref to the sensing voltage Vsen.

In the charge sharing process, in particular, when the memory cell MC is in the set state, the voltage level $V_{WL\_SET}$ of the word line WL may be reduced by the charge sharing. At this time, if the mount of decrease is high, the sensing margin of the SA can be reduced. The sensing margin SM may be represented by Equation 1.

$$SM = V_{sen\_set} - V_{sen\text{-reset}} = C_A/(C_A + C_{DL}) \times (V_{WL\_SET} - V_{WL\_RST})$$ [Equation 1]

Wherein $C_{DL}$ represents the capacitor of the data line, Vsen_set represents the sensing voltage when the memory cell is in the set state, that is, the voltage level of the data line, Vsen_reset represents the voltage level of the sensing voltage when the memory cell is in the reset state, $V_{WL\_SET}$ represents the voltage level of the word line when the memory cell is in the set state, in which $V_{WL\_SET}$ may have the voltage level reduced by the inhibit voltage Vs from the threshold voltage Vth. $V_{WL\_RST}$ represents the voltage level of the word line when the memory cell is in the reset state. Considering the leakage current (for example, the current flowing into the word line through unselected memory cells connected to the same word line) flowing in the word line WL during the bit line precharge period, $V_{WL\_RST}$ may have the voltage level corresponding to the amount of charge charged in the word line WL during the bit line precharge period, divided by the capacitance of the word line capacitor $C_A$. Referring to Equation 1, it may be found that the sensing margin SM may be proportional to the word line capacitor $C_A$.

According to a reading method of a memory device according to an example embodiment of the inventive concepts, the word line selection transistor TRx may be weakly turned on in the second precharge period T_P2, and thus the data line DL may be charged by the leakage current of the word line selection transistor TRx, thereby having the same effect as the increase of the word line capacitor $C_A$.

Accordingly, the change amount of the voltage level $V_{WL\_SET}$ of the word line WL, that is, the drop amount of the voltage level when the memory cell is in the set state, may be less than the change amount of the voltage level $V_{WL\_SET}$ of the word line WL when the selection transistor TRx is turned off in the second precharge period T_P2 according to a reading method according to a comparative example. Therefore, the sensing margin SM may be increased than a sensing margin SM' according to the comparative example.

Figure 11:
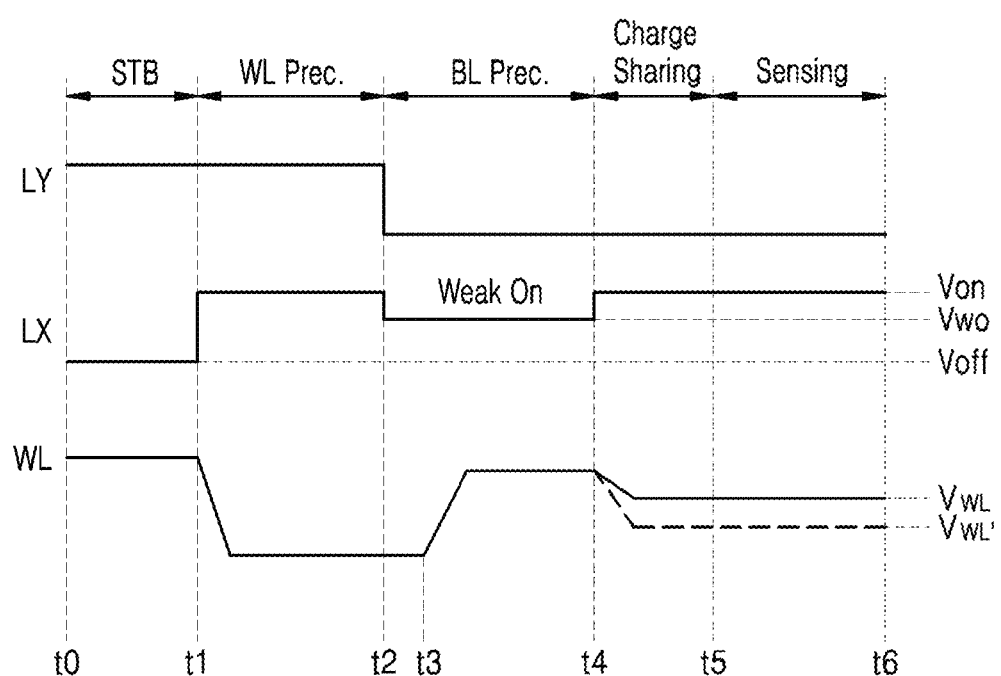
FIG. 11 illustrates a reading method of a memory device according to an example embodiment of the inventive concepts.

FIG. 11 illustrates a reading method of a memory device according to an example embodiment of the inventive concepts. FIG. 11 shows levels of the word line selection signal LX and the bit line selection signal LY at each stage when the read operation is performed, and also shows the voltage of the word line WL when the memory cell is in the set state.

Referring to FIG. 11, in a standby operation from time t0 to time t1, the word line selection signal LX may be at the low level, and the bit line selection signal LY may be at the high level. Accordingly, the word line selection transistor TRx and the bit line selection transistor TRy may be turned off. The word line WL may be floated, or may have a voltage level of 0V.

Thereafter, the word line selection signal LX may change to the high level at time t1, and the word line WL may be precharged based on the first precharge voltage Vp1. The first precharge voltage Vp1 may be a negative voltage. Accordingly, the voltage level $V_{WL}$ of the word line WL may drop.

The bit line selection signal LY may change to the low level at time t2, and the bit line BL may be precharged based on the second precharge voltage Vp2. The second precharge voltage Vp2 may be higher than the first precharge voltage Vp1 and may be a positive voltage. At this time, a weak-on voltage Vwo may be provided as the word line selection signal LX. In other words, the word line selection signal LX may have a weak-on level. The weak-on level Vwo may be higher than an off level Voff of the word line selection transistor TRx (that is, the low level of the word line selection signal LX) and may be lower than an on level Von of the word line selection transistor TRx (that is, the high level of the word line selection signal LX). For example, the weak-on voltage Vwo may be equal to 50-75% of the on level Von. The word line selection transistor TRx may be weakly turned on based on the word line selection signal LX of the weak-on level. The word line WL may be pseudo floated.

As described with reference to FIG. 9, when the difference between the voltage level of the bit line BL and the voltage level of the word line WL is greater than or equal to the threshold voltage of the memory cell, for example, at time t3, the cell current may flow through the memory cell. Since the memory cell is in the set state, a larger amount of cell current may flow than in the reset state, and as the cell current may charge the capacitor $C_A$ in FIG. 8 of the word line WL, the voltage level $V_{WL}$ of the word line WL may increase. Since the word line selection transistor TRx is weakly turned on, the leakage current of the word line selection transistor TRx may charge the capacitor $C_{DL}$ of the data line DL in FIG. 8, and thus the voltage level of the data line DL may increase. In other words, since the word line selection transistor TRx may be weakly turned on, the capacitor $C_A$ of the word line WL may appear to be increased.

As the word line selection signal LX may be changed to the high level at time t4 and the word line selection transistor TRx may be turned on, the word line WL may be connected to the data line DL. Charge sharing may be performed between the word line WL and the data line DL. Since the voltage level of the data line DL may be lower than the voltage level $v_{WL}$, of the word line WL, the voltage level $V_{WL}$ of the word line WL may be lowered and the voltage level of the data line DL may be increased, and thus the voltage levels of the word line WL and the data line DL may be the same.

Thereafter, data sensing may be performed from time t5 to time t6, that is, a data sensing period. As described above, the word line selection transistor TRx may be weakly turned on in the bit line precharge period, for example, the period from time t2 to time t4, so that the drop amount of the voltage level $V_{WL}$ of the word line WL in the precharge period may decrease than the drop amount of the voltage level $V_{WL}$ of the word line WL when the word line selection transistor TRx is turned off. Thus, the sensing margin may be increased.

Figure 12A:
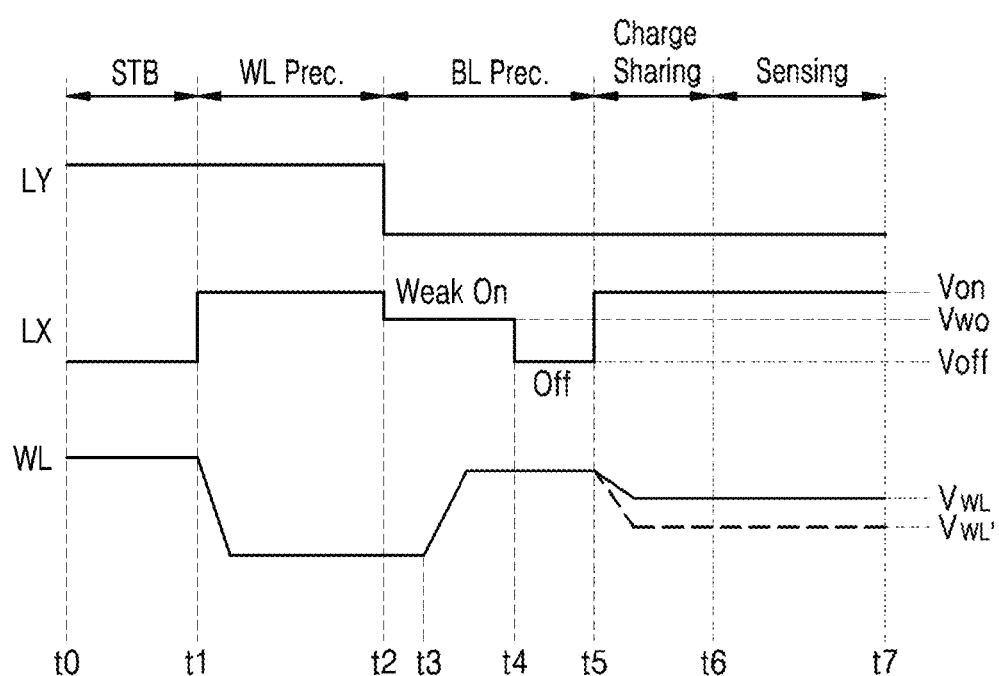
FIGS. 12A and 12B illustrate a reading method of a memory device according to an example embodiment of the inventive concepts.
Figure 12B:
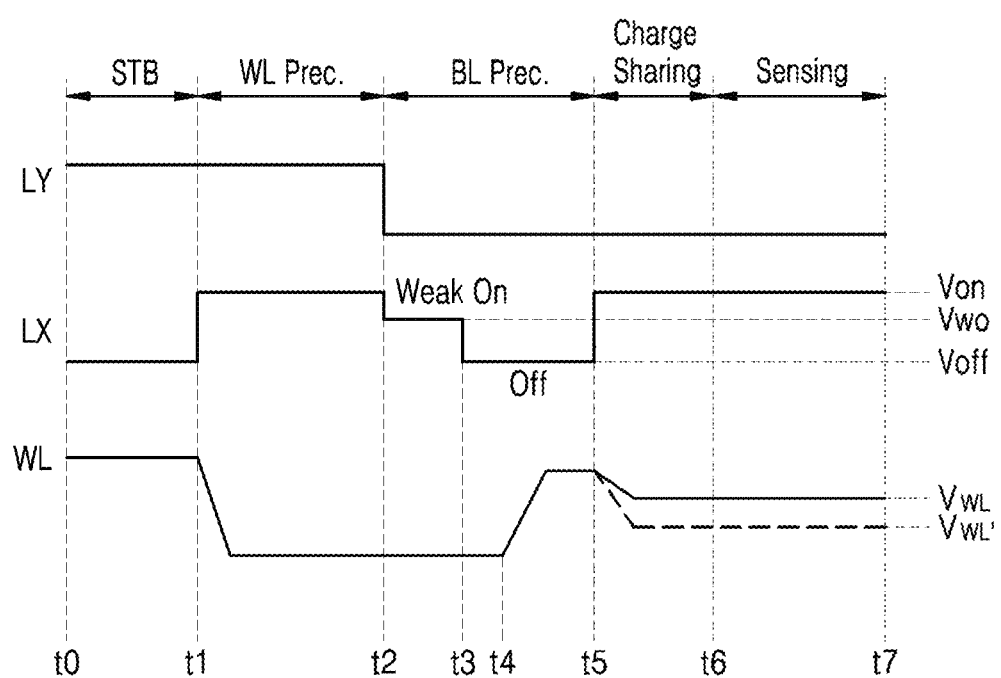

FIGS. 12A and 12B illustrate a reading method of a memory device according to an example embodiment of the inventive concepts. The reading method of FIGS. 12A and 12B may be similar to the reading method of FIG. 11. However, since the voltage level of the word line selection signal LX may be different in the bit line precharge period compared to the reading method of FIG. 11, the following discussion will focus on their differences.

Figure 13:
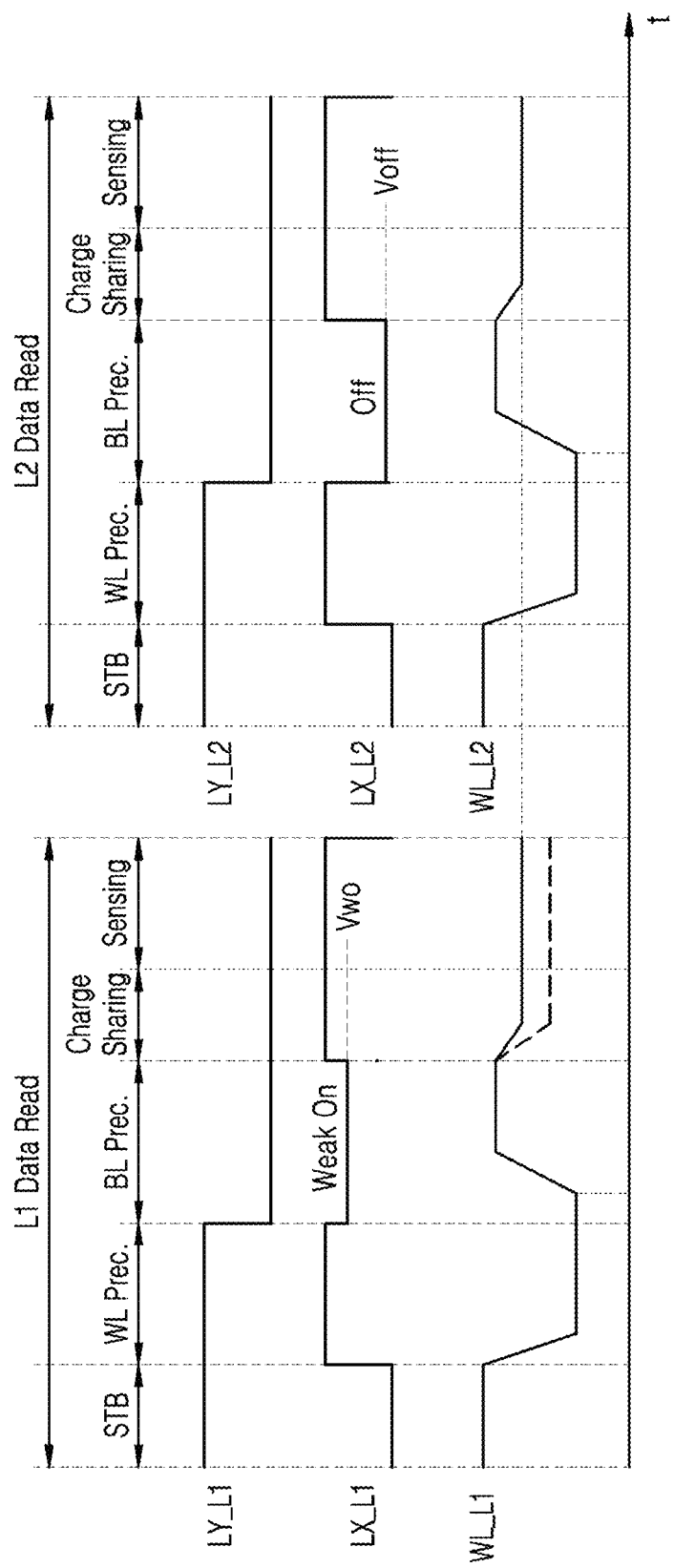
FIG. 13 illustrates a reading method of a memory device according to an example embodiment of the inventive concepts.

FIGS. 12A and 12B, the word line selection signal may have the weak-on level Vwo in at least some of the bit line precharge period, for example, from time t2 to time t5 and may have the off level Voff in the remaining period. For example, the weak-on voltage Vwo is applied during 50-90% of the bit line precharge period. Accordingly, the word line selection transistor TRx may be weakly turned on in some period of the bit line precharge period and may be turned off in the remaining period. The length of the some period in which the word line selection transistor TRx may be weakly turned on may be adjusted based on the capacitance of the word line capacitor $C_A$. For example, as the capacitance of the word line capacitor $C_A$ increases, the length of some period in which the word line selection transistor TRx is weakly turned on in the bit line precharge period may decrease. As shown in FIG. 12A, after a switching device of the memory cell is turned on at time t3 and then the voltage level of the word line WL is increased, the word line selection transistor TRx may be turned off at time t4. However, the inventive concepts are not limited thereto, and as illustrated in FIG. 12B, the word line selection transistor TRx may be turned off, for example, at time t3 in FIG. 12B, prior to a time point, for example, time t4 in FIG. 12B, at which the voltage level of the word line WL is increased by turning on the switching device of the memory cell. FIG. 13 illustrates a reading method of a memory device according to an example embodiment of the inventive concepts. FIG. 13 illustrates the voltage levels of the word line selection signals LX_L1 and LX_L2, the bit line selection signals LY_L1 and LY_L2 and the word lines WL_L1 and WL_2 in a data reading operation of the first layer L1 and the data reading operation of the second layer L2. In some embodiments, it is assumed that the selected memory cell of the first layer L1 and the selected memory cell of the second layer L2 are in the set state.

Referring to FIG. 13, the levels of the word line selection signals LX_L1 and LX_L2 may be differently applied in the data reading operation of the first layer L1 and the data reading operation of the second layer L2. Hereinafter, for convenience of description, the word line WL_L1 of the first layer L1 will be referred to as the first word line, and the word line WL_L2 of the second layer L2 will be referred to as the second word line WL_L2, herein. In addition, a word line capacitor of the first word line WL_L1 will be referred to as a first word line capacitor $C_{A1}$ and a word line capacitor of the second word line WL_L2 will be referred to as a second word line capacitor $C_{A2}$.

In the data reading operation of the first layer L1, the word line selection signal LX_L1 applied to the word line selection transistor connected to the first word line WL_L1 may have the weak-on level Vwo in the bit line precharge period. In the data reading operation of the second layer L2, the word line selection signal LX_L2 applied to the word line selection transistor connected to the second word line WL_L2 may have the off level Voff in the bit line precharge period. In some embodiments, the second word line capacitor $C_{A2}$ may be greater than the first word line capacitor $C_{A1}$.

Figure 14A:
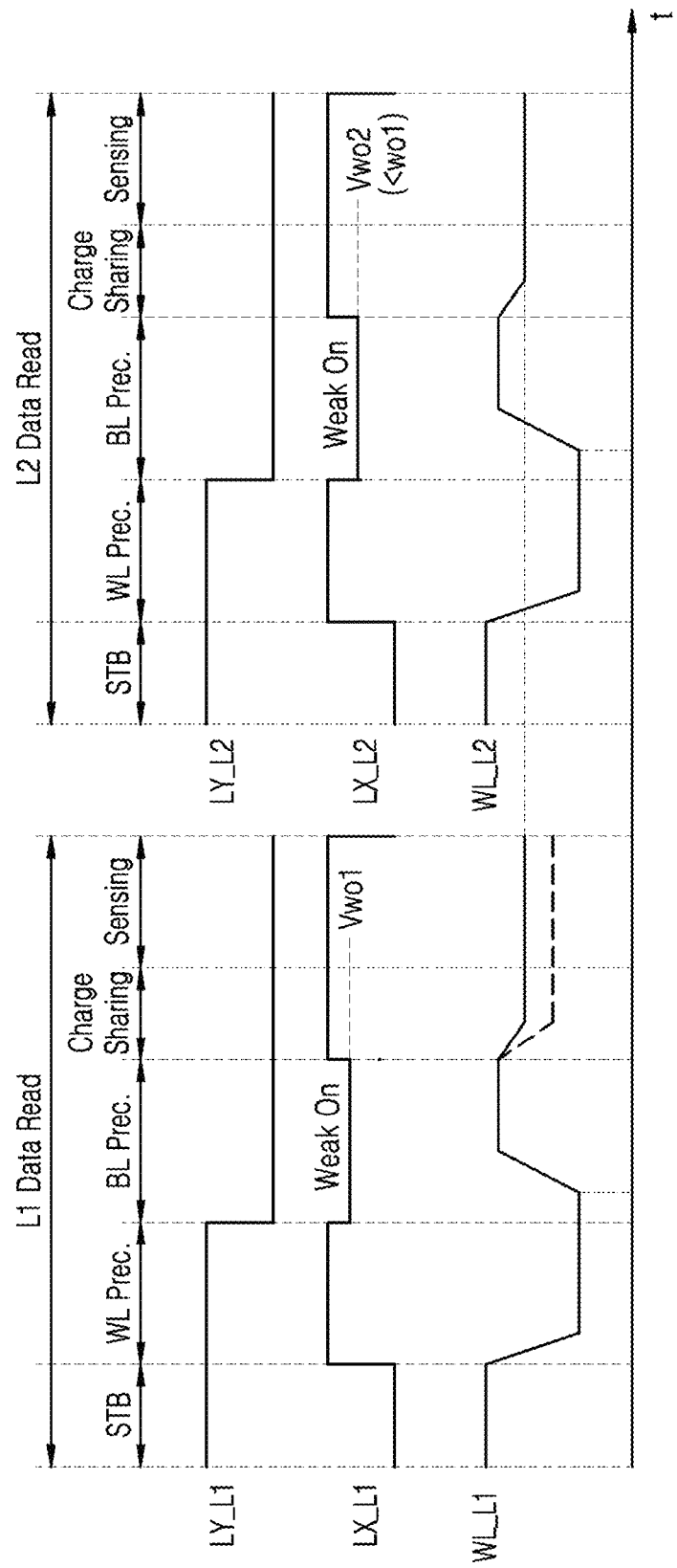
FIGS. 14A, 14B and 14C illustrate a reading method of a memory device according to an example embodiment of the inventive concepts.
Figure 14B:
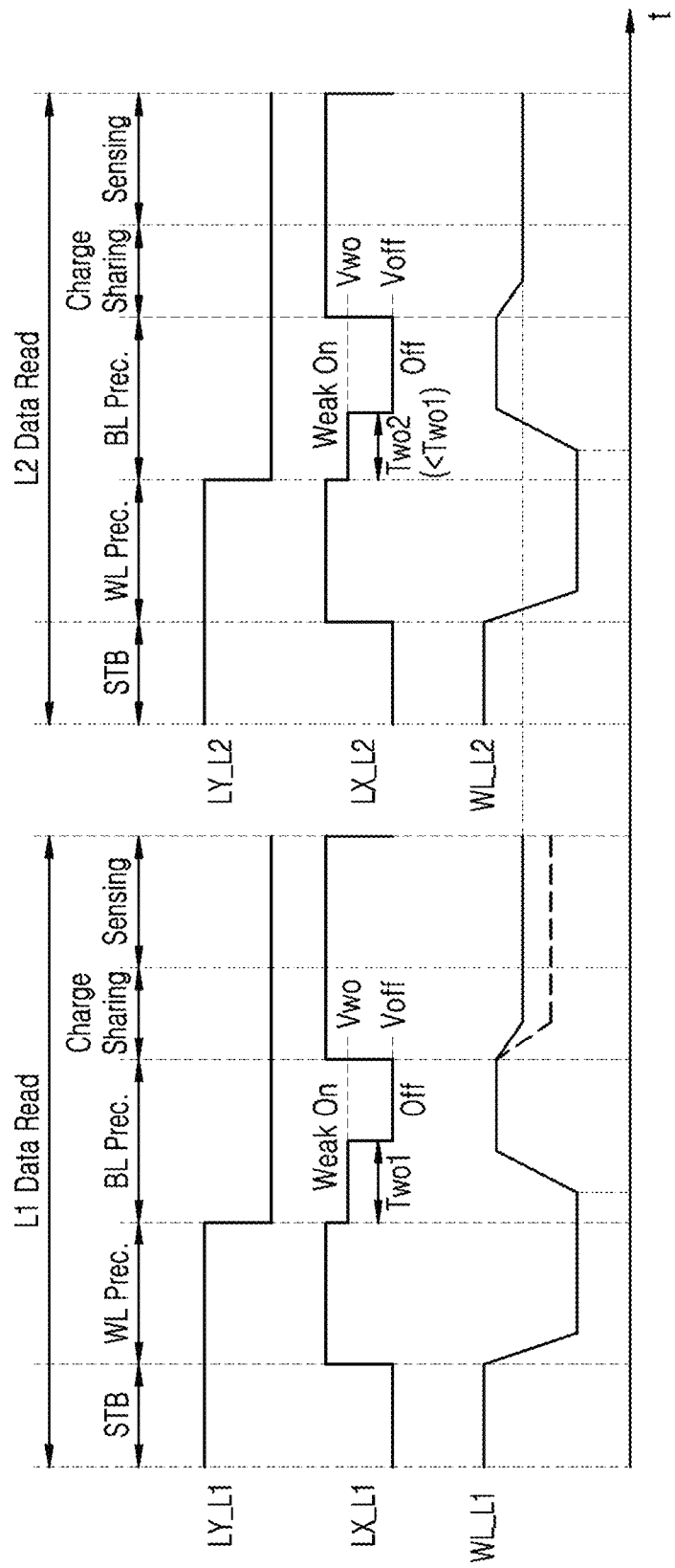
Figure 14C:
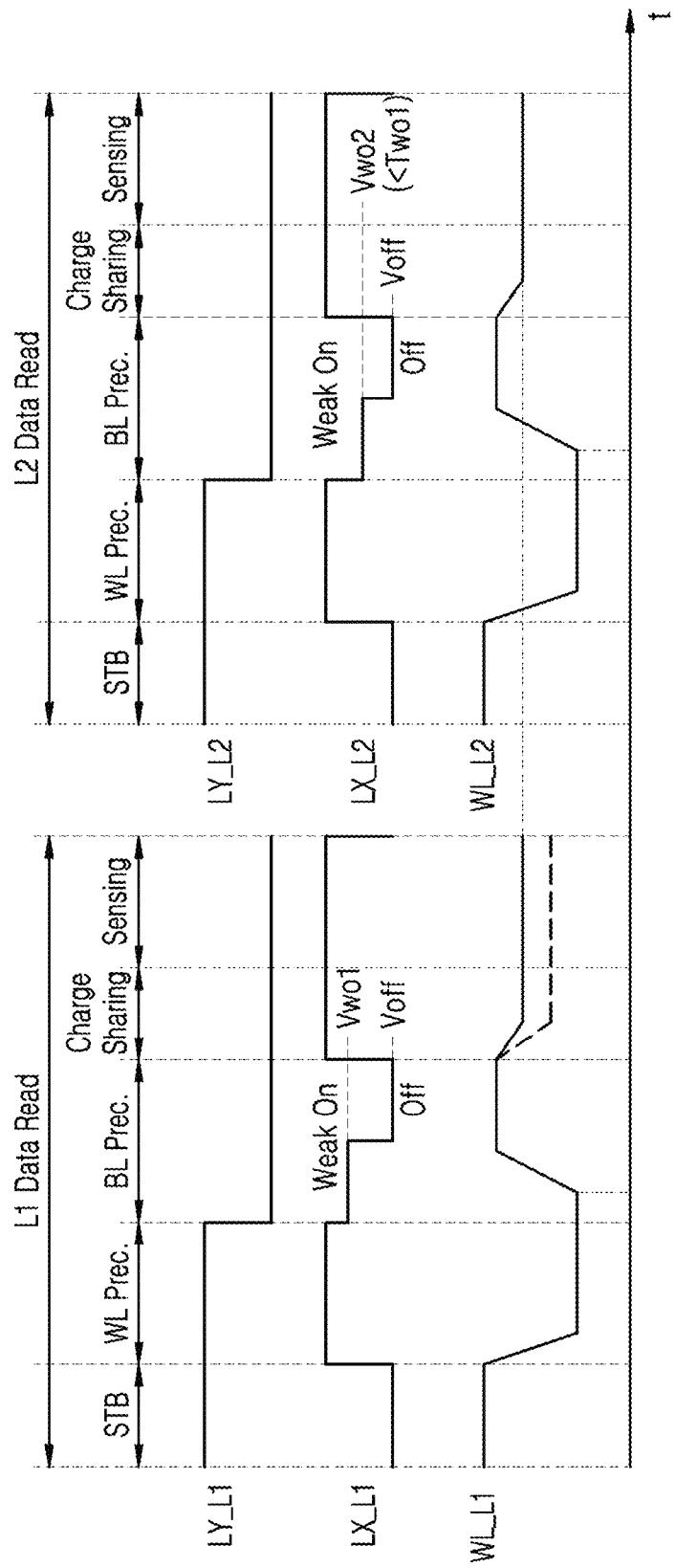

As described above, the word line capacitor $C_A$ may affect the sensing margin, and thus the larger the word line capacitor $C_A$, the higher the sensing margin. When the data reading operation is performed with respect to the first layer L1 having a relatively small word line capacitor $C_A$, the word line selection signal LX_L1 of the weak-on level Vwo may be applied to the word line selection transistor in the bit line precharge period to weakly turn on the word line selection transistor and thus the first word line capacitor $C_{A1}$ may be increased. Therefore, the effect may appear that the first word line capacitor Cm and the second word line capacitor $C_{A2}$ of the second layer L2 are the same or similar. Accordingly, the voltage level of the first word line WL_L1 and the voltage level of the second word line WL_L2 in a sensing period of the data reading operation of the first layer L1 and the data reading operation of the second layer L2, respectively, may be the same or similar, and thus sensing margins of the first layer L1 and the second layer L2 may be the same or similar. FIGS. 14A, 14B and 14C illustrate a reading method of a memory device according to an example embodiment of the inventive concepts. FIGS. 14A, 14B, and 14C illustrate examples in which word line selection signals LX_L1 and LX_L2 of different levels or waveforms are provided to the first layer L1 and the second layer L2 during the read operation of the memory device.

Referring to FIG. 14A, the levels of the word line selection signals LX_L1 and LX_L2 may be differently applied in the data reading operation of the first layer L1 and the data reading operation of the second layer L2.

In the data reading operation of the first layer L1, the word line selection signal LX_L1 applied to the word line selection transistor connected to the first word line, that is, the word line selection signal LX_L1 applied to the first layer L1, may have a first weak-on level Vwo1 in the bit line precharge period, and in the data reading operation of the second layer L2, the word line selection signal LX_L2 applied to the word line selection transistor connected to the second word line, that is, the word line selection signal LX_L2 applied to the second layer L2, may have a second weak-on level Vwo2 in the bit line precharge period. The second weak-on level Vwo2 may be lower than the first weak-on level Vwo1.

Accordingly, the word line selection transistor TRx of the first layer L1 and the word line selection transistor TRy of the second layer L2 may be weakly turned on in the bit line precharge period. However, the amount of leakage current flowing through the word line selection transistor TRx of the first layer L1 may be relatively greater than the amount of leakage current flowing through the word line selection transistor TRx of the second layer L2. Accordingly, the first word line capacitor Cm may appear to be increased relatively more than the second word line capacitor $C_{A2}$, and therefore, the effect may appear that the first word line capacitor Cm and the second word line capacitor $C_{A2}$ are the same or similar. In other words, the voltage level of the first word line WL_L1 and the voltage level of the second word line WL_L2 in the sensing period of the data reading operation of the first layer L1 and the data reading operation of the second layer L2, respectively, may be the same or similar, and thus sensing margins of the first layer L1 and the second layer L2 may be the same or similar.

Referring to FIG. 14B, in the data reading operation of the first layer L1 and the data reading operation of the second layer L2, each of the word line selection signals LX_L1 and LX_L2 may have the weak-on level Vwo in a portion of the bit line precharge period and may have the off level Voff in the remaining portion thereof. In some embodiments, a period in which the word line selection signal LX_L1 applied to the first layer L1 has the weak-on level Vwo, for example, the first weak-on period Two1, may be different from the period in which the word line selection signal LX_L2 applied to the second layer L2 has the weak-on level Vwo2, for example, the second weak-on period Two2. For example, the second weak-on period Two2 may be shorter than the first weak-on period two1.

Referring to FIG. 14C, in the data reading operation of the first layer L1 and the data reading operation of the second layer L2, each of the word line selection signals LX_L1 and LX_L2 may have the weak-on level Vwo in a portion of the bit line precharge period and may have the off level Voff in the remaining portion thereof.

At this time, in the data reading operation of the first layer L1, the word line selection signal LX_L1 applied to the first layer L1 may have the first weak-on level Vwo1 in the bit line precharge period and in the data reading operation of the second layer L2, the word line selection signal LX_L2 applied to the second layer L2 may have a second weak-on level Vwo2 in the bit line precharge period. The first weak-on level Vwo1 and the second weak-on level Vwo2 may be different.

Figure 15:
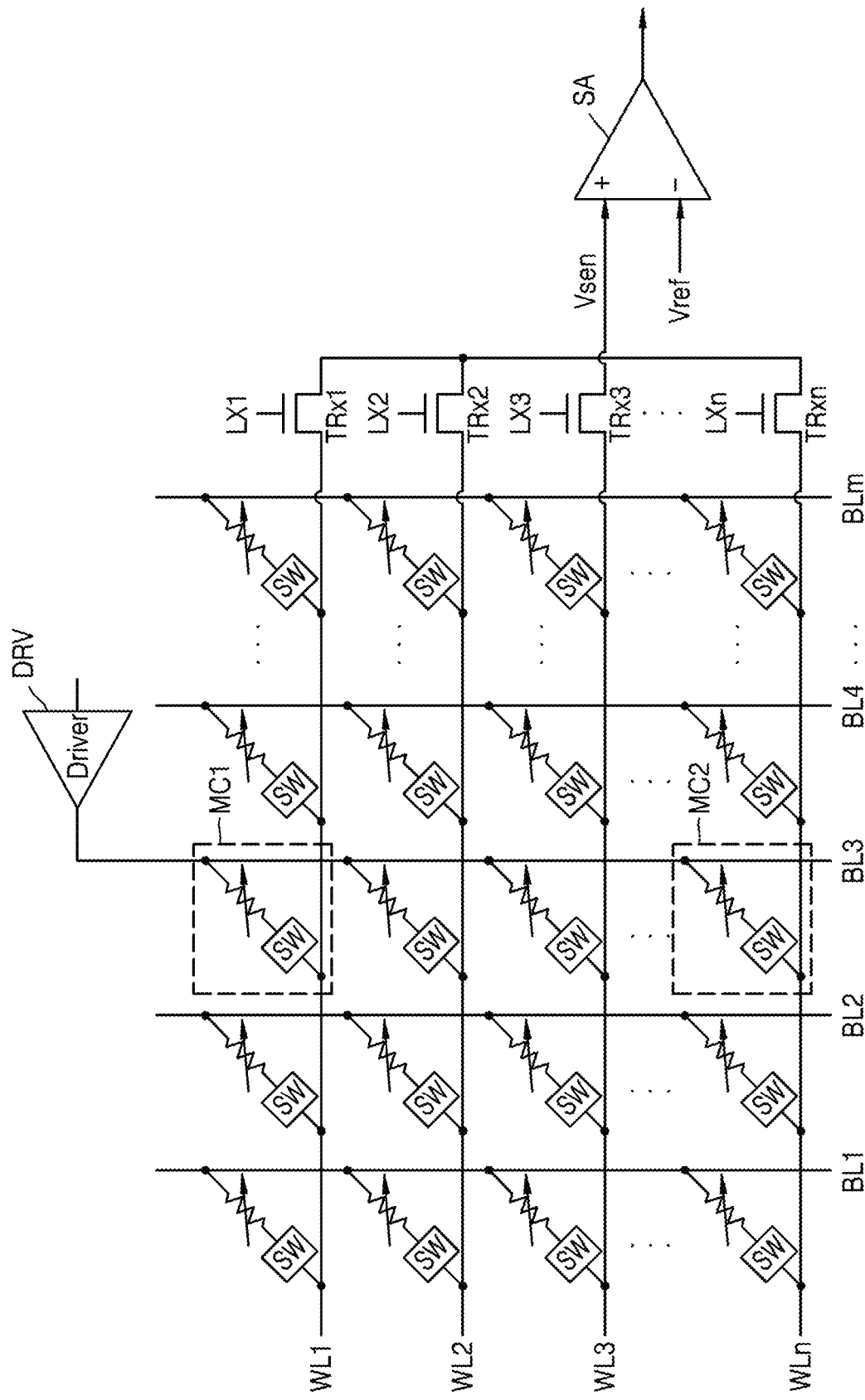
FIG. 15 is a circuit diagram illustrating a reading method of a memory device according to an example embodiment of the inventive concepts.
Figure 16A:
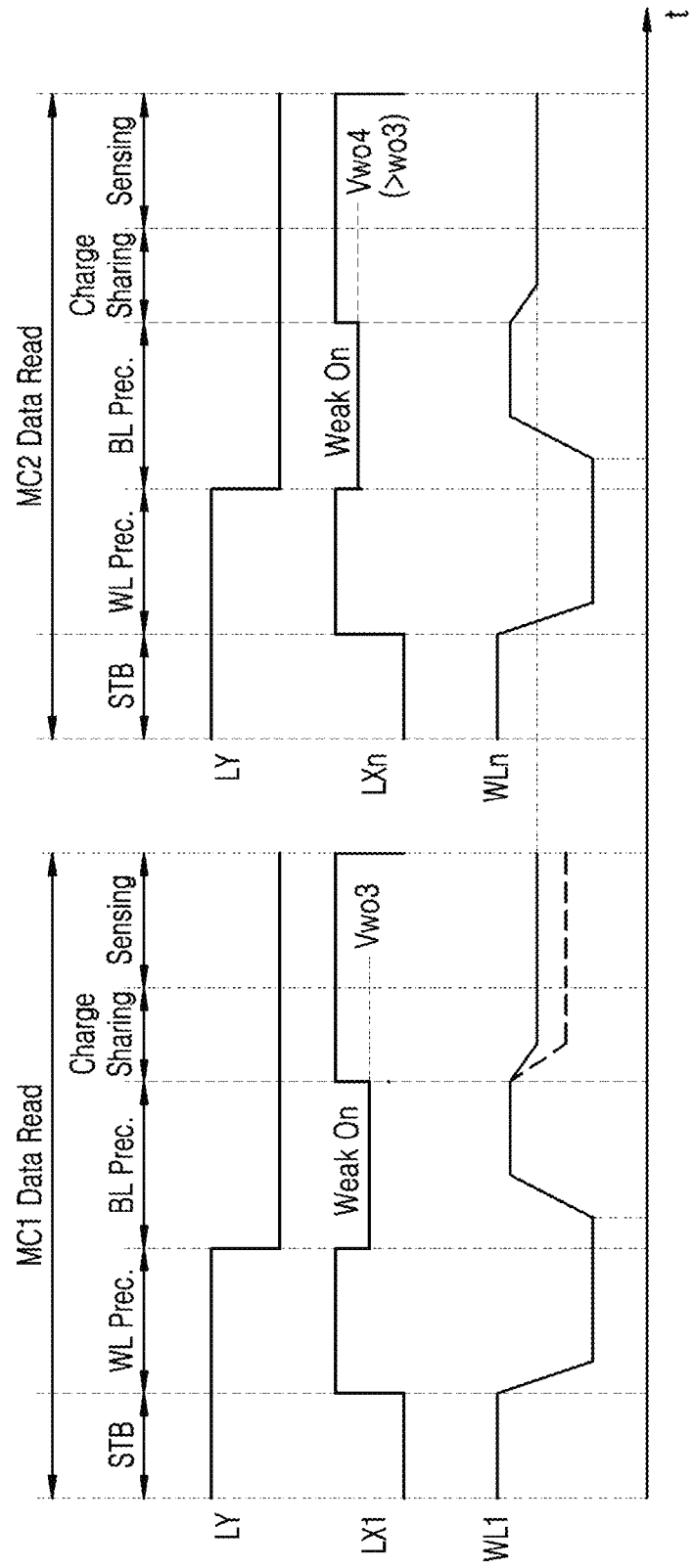
FIGS. 16A, 16B and 16C illustrate a reading method of a memory device according to an example embodiment of the inventive concepts.
Figure 16B:
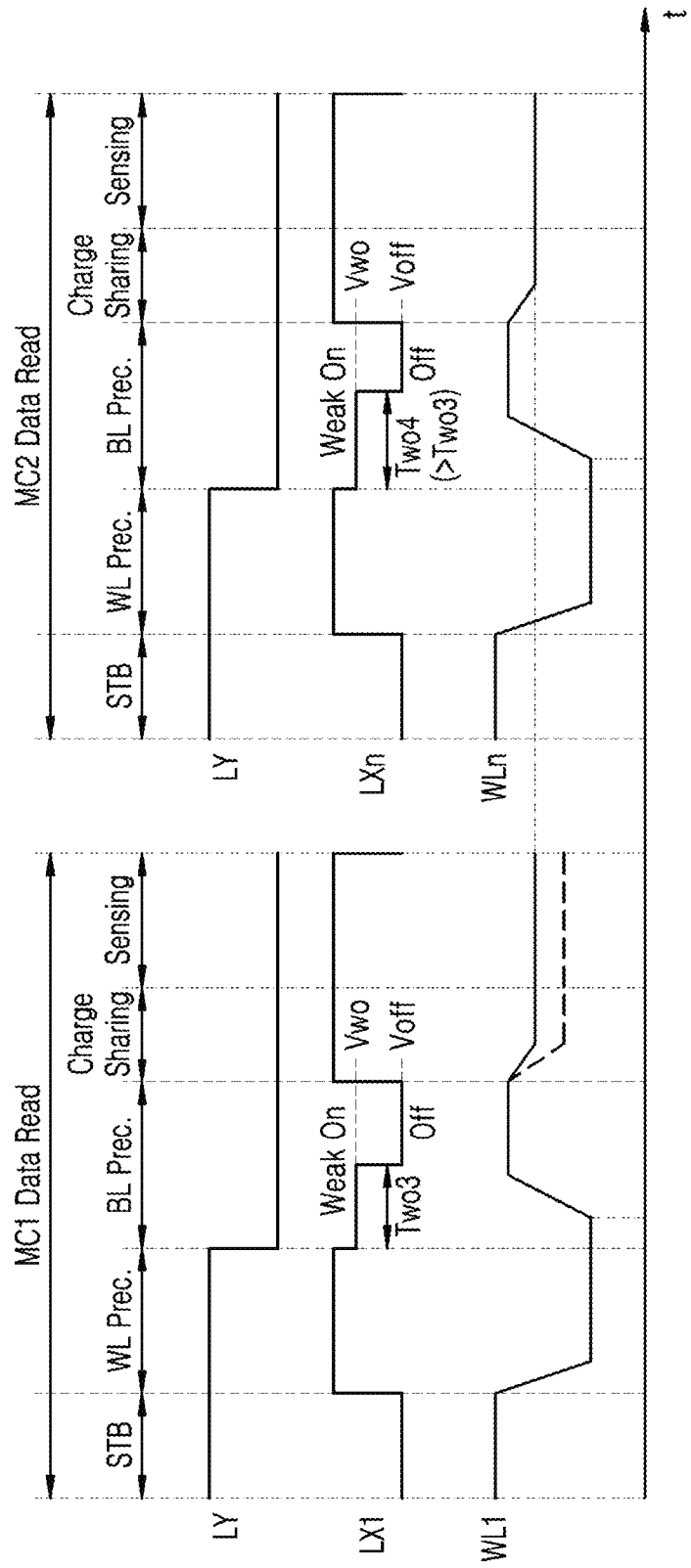
Figure 16C:
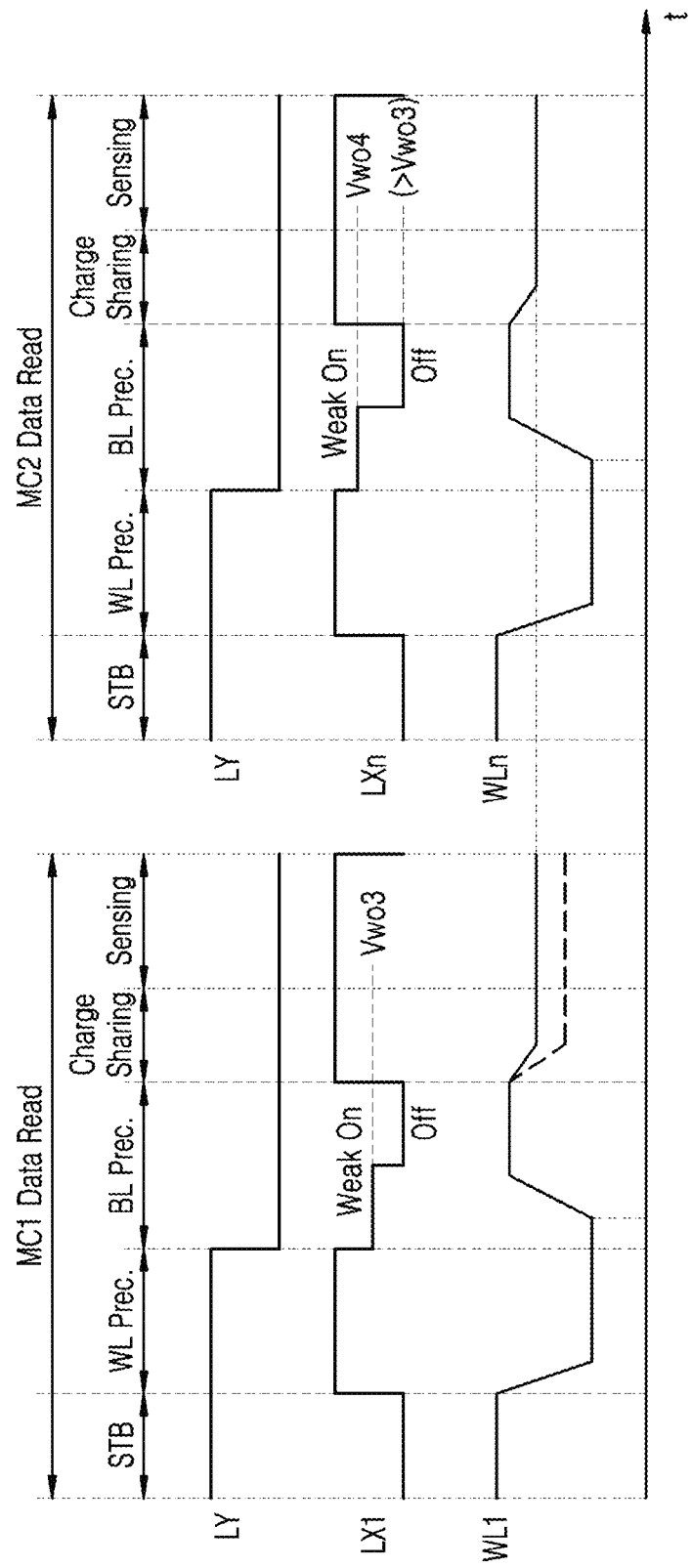

In an example embodiment, when a period in which the word line selection signal LX_L1 applied to the first layer L1 maintains the first weak-level Vwo1 and a period in which the word line selection signal LX_L2 applied to the second layer L1 maintains the second weak-on level Vwo2 are the same, the second weak-on level Vwo2 may be lower than the first weak-on level Vwo1. However, the inventive concepts are not limited thereto, and a period in which the word line selection signal LX_L1 applied to the first layer L1 maintains the first weak-level Vwo1 may different from a period in which the word line selection signal LX_L2 applied to the second layer L1 maintains the second weak-on level Vwo2, and thus the first weak-on level Vwo1 and the second weak-on level Vwo2 may vary depending on the lengths of the periods. FIG. 15 is a circuit diagram illustrating a method of reading a memory device according to an example embodiment of the inventive concepts, and FIGS. 16A, 16B, and 16C illustrate a method of reading a memory device according to an example embodiment of the inventive concepts. A reading method according to the position of the selected memory cell will be described with reference to FIGS. 15 and 16A to 16C.

Referring to FIG. 15, the sense amplifier SA may be connected to the word line connected to the selected memory cell among the word lines WL1 to WLn, and may compare the voltage level of the word line to the reference voltage Vref and then may read data of the selected memory cell.

As described with reference to FIGS. 7 to 14, after the word line precharge, the bit line precharge may be performed, and in the bit line precharge period, the row switch connected to the selected word line, for example, word line selection transistors TRx1 to TRxn may be weakly turned on in response to the word line selection signals LX1 to LXn of the corresponding weak-on level. Accordingly, the sensing margin of the sense amplifier SA may be increased.

The precharge voltage may be applied to the bit lines through a driver DRV (or the column decoder connected to the bit lines) connected to each bit line. For example, the driver DRV may include the bit line precharge transistor TRb and the clamp transistor $TR_{CMP}$ of FIG. 8. In some embodiments, the word line selection signal LX may be applied differently according to the distance between the driver for applying the precharge voltage to the bit lines and the memory cells to be read, that is, the selected memory cells. For example, the weak-on level and/or turn-off time of the word line selection signal LX may be applied differently. This will be described with reference to FIGS. 16A to 16C.

Referring to FIG. 16A, the weak-on level of the word line selection signal LX when the reading is performed with respect to a memory cell located far from the driver may be higher than the weak-on level of the word line selection signal LX when the reading is performed with respect to a memory cell located near the driver.

For example, in FIG. 15, the distance between the first memory cell MC1 and the driver may be less than the distance between the second memory cell MC2 and the driver. Referring to FIG. 16A, in the data reading operation of the first memory cell MC1, the first word line selection signal LX1 may have a third weak-on level in the bit line precharge period and in data reading operation of the second memory cell MC2, an n-th word line selection signal LXn may have a fourth weak-on level in the bit line precharge period. In some embodiments, the fourth weak-on level may be higher than the third weak-on level. In other words, the word line selection transistor TRx1 or TRn may be weakly turned on in the bit line precharge period, and at this time, the n-th word line selection transistor TRxn connected to the second memory cell MC2 located farther from the driver than the first word line selection transistor TRx1 connected to the first memory cell MC1 located close to the driver may be turned on more strongly.

The read disturb characteristics may be considered when the word line selection transistors TRx1 to TRxn are weakly turned on in the bit line precharge period to increase the sensing margin. As the degree of turn-on of the selection transistor increases, the read disturb characteristic may deteriorate. On the other hand, as the distance between the driver and the memory cell increases, the resistance component of the current path may increase and the cell current may decrease, so that the read disturb characteristics may be good. Therefore, as described above, by adjusting the degree of turn-on of the word line selection transistor connected to the memory cell in consideration of the distance of the memory cell from the driver, the sensing margin may be increased while maintaining the read disturb characteristics of the memory cells at a constant level.

Referring to FIG. 16B, in the data reading operation of the first memory cell MC1 and the data reading operation of the second memory cell MC2, each of the first word line selection signal LX1 and the n-th word line selection signal LXn may have a weak-on level Vwo in a portion of the bit line precharge period and may have the off level Voff in the remaining period thereof. Accordingly, after the first word line selection transistor TRx1 and the n-th word line selection transistor TRxn may be weakly turned on and then may be turned off in the bit line precharge period.

In some embodiments, a period in which the first word line selection signal LX1 has the weak-on level Vwo, for example, a third weak-on period Two3, may be different from a period in which the second word line selection signal LX2 has the weak-on level Vwo, for example, a fourth weak-on period Two4. For example, the fourth weak-on period Two4 may be longer than the third weak-on period Two3.

Referring to FIG. 16C, in the data reading operation of the first memory cell MC1 and the data reading operation of the second memory cell MC2, each of the first word line selection signal LX1 and the n-th word line selection signal LXn may have the weak-on level in a portion of the bit line precharge period and may have the off level Voff in the remaining period thereof.

In some embodiments, in the data reading operation of the first memory cell MC1, the first word line selection signal LX1 may have the third weak-on level Vwo3 in the bit line precharge period, and in the data reading operation of MC2, the n-th word line selection signal LXn may have the fourth weak-on level Vwo4 in the bit line precharge period. The third weak-on level Vwo1 and the fourth weak-on level Vwo4 may be different.

In some embodiments, when the period in which the first word line selection signal LX1 maintains the third weak-on level Vwo3 and the period in which the n-th word line selection signal LXn maintains the fourth weak-on level Vwo4 are the same, the fourth weak-on level Vwo4 may be higher than the third weak-on level Vwo3. However, the inventive concepts are not limited thereto, the period in which the first word line selection signal LX1 maintains the third weak-on level Vwo3 may be different from the period in which the fourth n-th word line selection signal LXn, and also the third weak-on level Vwo3 and the fourth weak-on level Vwo4 may vary according to the lengths of the periods.

Figure 17:
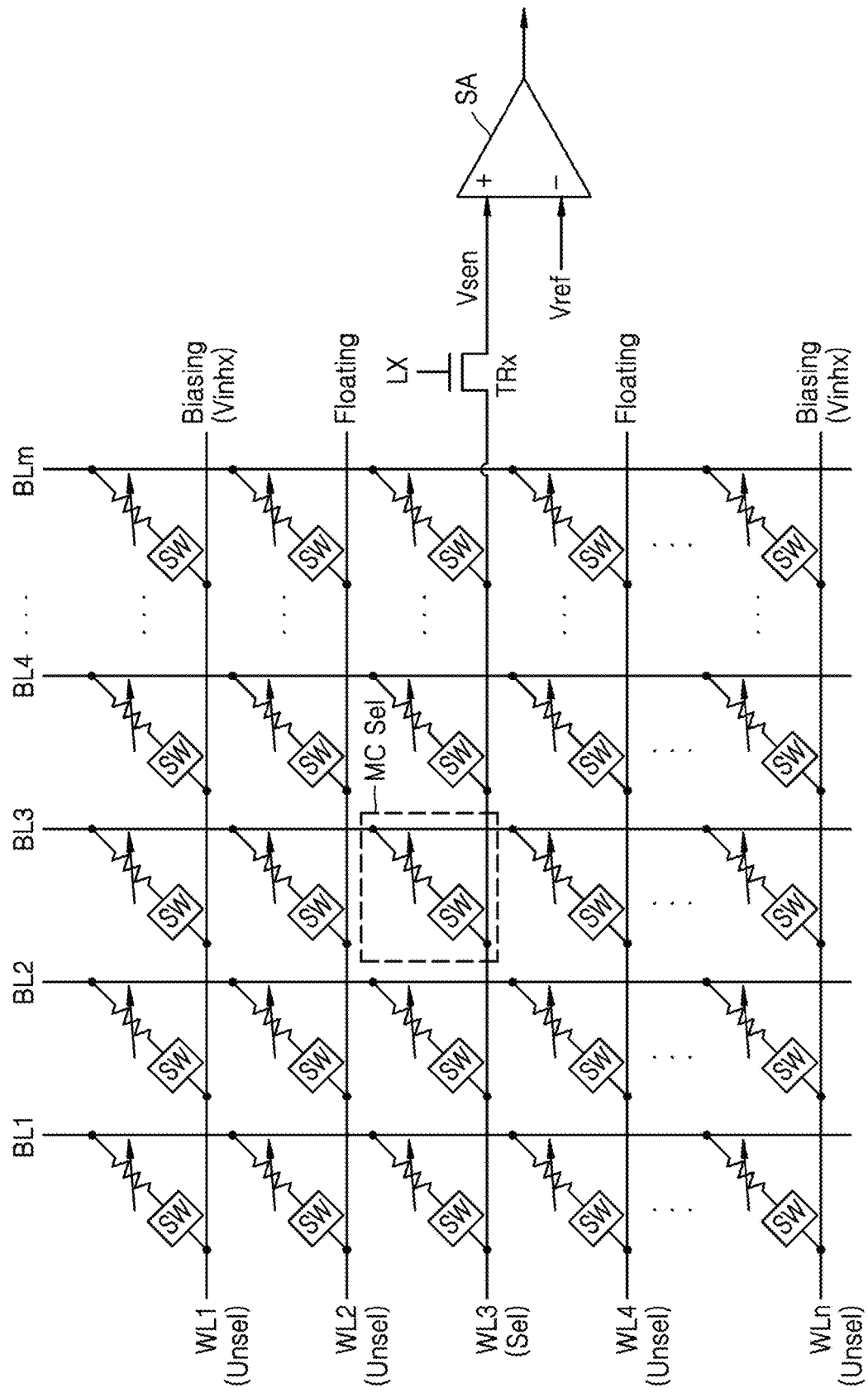
FIG. 17 is a diagram illustrating a reading method of a memory device according to an example embodiment of the inventive concepts.

FIG. 17 is a circuit diagram illustrating a method of reading of a memory device according to an example embodiment of the inventive concepts.

Referring to FIG. 17, when the data reading operation is performed on the selected memory cell MC_sel, the selected word line connected to the selected memory cell MC_sel, for example, the third word line WL3, may vary in the voltage level according to each operation, for example, the word line precharge operation, the bit line precharge operation, and the charge sharing operation. In some embodiments, a non-selected word line adjacent to the selected word line, for example, at least one word line adjacent to the selected word line among the first, second, fourth to n-th word lines WL1, WL2, and WL4 to WLn may be floated. In some embodiments, the at least one word line may be floated in the bit line precharge period and may be biased with the discharge voltage, for example, 0V, in the remaining periods.

Referring to FIG. 8 together, when the reading operation is performed, the word line selection transistor TRx connected to the unselected word line may be turned off, the discharge transistor $TR_{WP}$ may be turned on, and thus the discharge voltage Vdc, that is, the inhibit voltage Vinhx may be applied to the unselected word lines, whereby the unselected word line may be biased to a predetermined or alternatively, desired inhibit level. At this time, according to an embodiment of the inventive concepts, the discharge transistor $TR_{WP}$ connected to at least one unselected word line adjacent to the selected word line may be turned off in the bit line precharge period, whereby the at least one unselected word line may be floated.

In the reading operation, as at least one unselected word line adjacent to the selected word line is floated, parasitic capacitor components generated due to adjacent word lines among the parasitic capacitor components of the word line may be reduced.

In some embodiments, in a memory cell array having a three-dimensional cross point structure, when the word line capacitor components of the first and second layers are different and the word line capacitor components of the second layer are greater than the word line capacitor components of the first layer, all unselected word lines may be biased to the inhibit level in the reading operation with respect to the first layer, and at least one unselected word line adjacent to the selected word line among the unselected word lines may be floated in the bit line precharge period in the reading operation with respect to the second layer.

In an example embodiment, in the reading operation with respect to the first layer, N unselected word lines (N is a positive integer) adjacent to the selected word line among the unselected word lines may be floated in the bit line precharge period, and in the reading operation with respect to the second layer, M unselected word lines (M is a positive integer greater than N) adjacent to the selected word line among the unselected word lines may be floated in the bit line precharge period.

Accordingly, the parasitic capacitor components of the selected word line of the second layer may be reduced relatively much and the capacitor components of the selected word lines selected from the first layer and the second layer may be seen to be the same, and therefore, the read disturb characteristics may be the same.

In some embodiments, as described with reference to FIGS. 7 to 16C, the word line selection transistor connected to the selected word line selected in the bit line precharge period may be weakly turned on in response to the control signal of the weak-on level.

In some embodiments, the first word line selection transistor connected to the selected word line of the first layer may be weakly turned on in the bit line precharge period and the second word line selection transistor connected to the selected wordline of the second layer may be turned off in the bit line precharge period. Alternatively, the control signal applied to the first word line selection transistor may be closer to the on-level than the control signal applied to the second word line selection transistor.

Figure 18A:
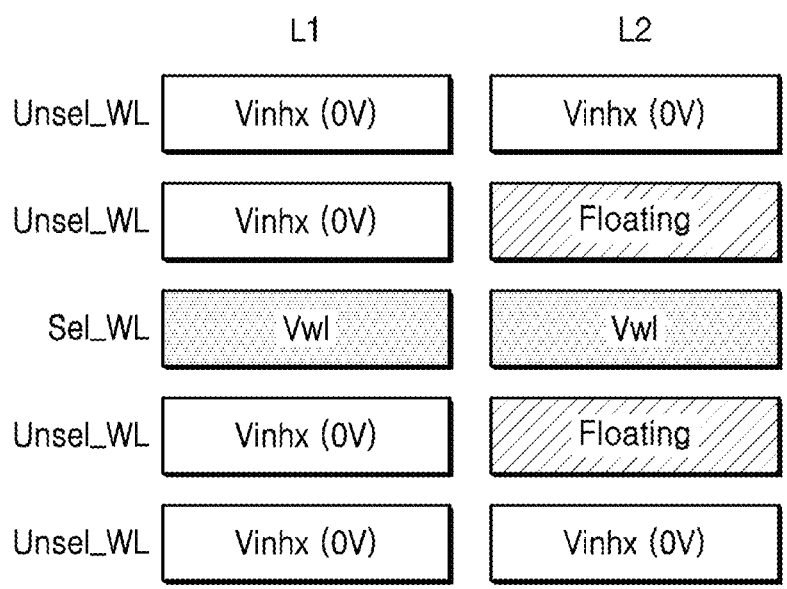
FIGS. 18A and 18B are diagrams illustrating a reading method of a memory device according to an example embodiment of the inventive concepts.
Figure 18B:
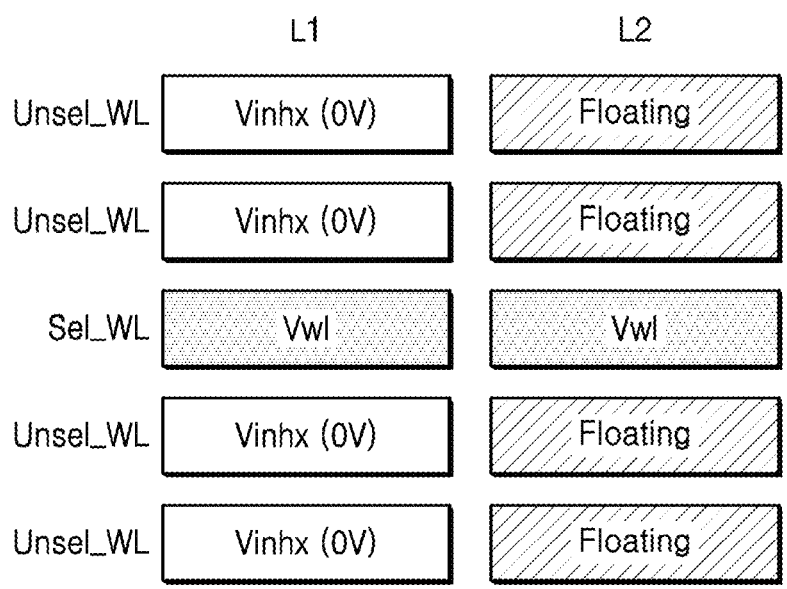

FIGS. 18A and 18B are diagrams illustrating a method of reading of a memory device according to an example embodiment of the inventive concepts. It will be described on the assumption that the capacitance of the word line capacitor of the second layer L2 is greater than the capacitance of the word line capacitor of the first layer L1.

Referring to FIG. 18A, the inhibit voltage Vinhx may be applied to unselected word lines Unsel_WL when the reading operation is performed with respect to the first layer L1. For example, the inhibit voltage Vinhx may be 0V. The unselected word lines Unsel_WL may be biased to 0V. When the reading operation is performed with respect to the second layer L2, the unselected word lines Unsel_WL adjacent to the selected word line Sel_WL among the unselected word lines Unsel_WL may floated, and the remaining unselected word lines may be biased to 0V. Although FIG. 18A illustrates that each one unselected word line closest to the selected word line in both directions of the selected word line is floated, the inventive concepts are not limited thereto, as shown in FIG. 18B, each two or more unselected word lines may be floated in both directions of the selected word line. In addition, as another example embodiment, the unselected word line adjacent to the selected word line in one direction of the selected word line may be floated.

Figure 19:
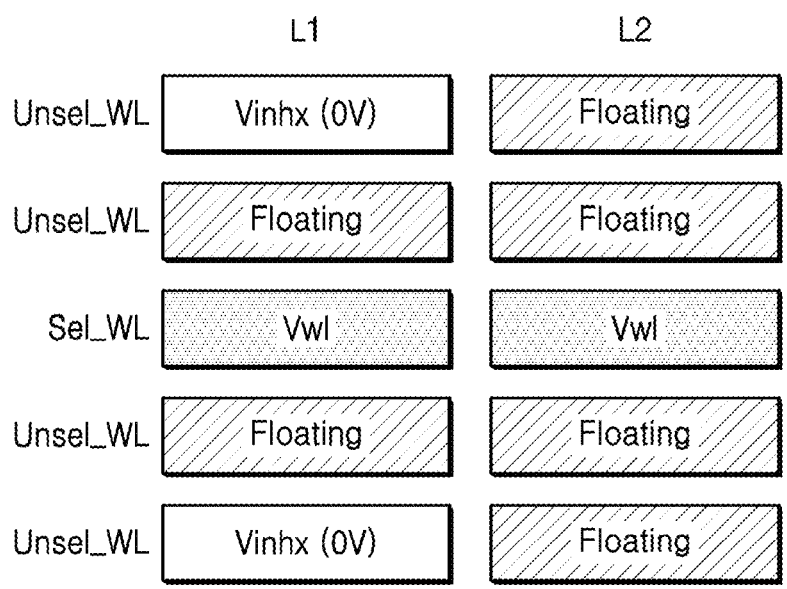
FIG. 19 is a diagram illustrating a reading method of a memory device according to an example embodiment of the inventive concepts.

FIG. 19 is a diagram illustrating a method of reading of a memory device according to an example embodiment of the inventive concepts.

Referring to FIG. 19, when the reading operation is performed with respect to the first layer L1 and when the reading operation is performed with respect to the second layer L2, unselected word lines Unsel_WL adjacent to the selected word line Sel_WL among the unselected word lines Unsel_WL may be floated, and the remaining unselected word lines may be biased to 0V. In some embodiments, the number of unselected word lines Unsel_WL to be floated when the reading operation is performed on the second layer L2 may be larger than the number of unselected word lines Unsel_WL to be floated when the reading operation is performed on the first layer L1.

Figure 20:
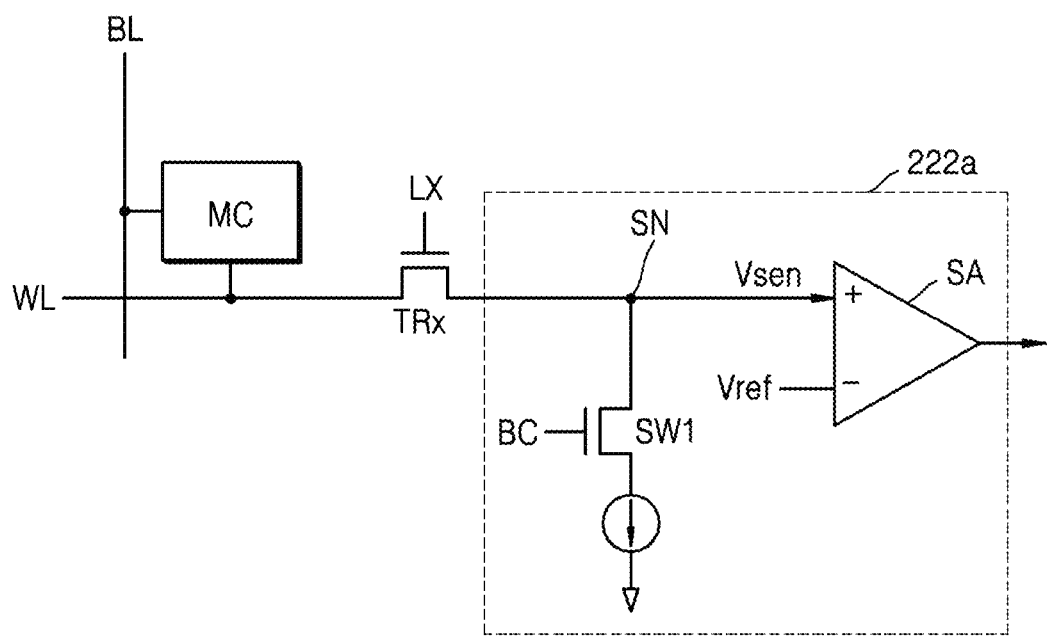
FIG. 20 is a circuit diagram illustrating an example of compensating for a leakage current in a data read operation.

FIG. 20 is a circuit diagram illustrating an example of compensating for the leakage current in the data read operation.

According to the above-described embodiments, the word line WL may be floated during the data reading process and the leakage current may be flowed into the floated word line WL due to various factors (for example, the plurality of unselected memory cells connected to the word line), which may cause the voltage level of the word line WL to fluctuate. In order to compensate for the influence of the leakage current, the leakage current may be discharged from a sensing node SN by using a current source.

Referring to FIG. 20, a compensation switch SW1 and the current source may be connected to the sensing node SN. Although an example in which the compensation switch SW1 is implemented as an NMOS transistor is illustrated, the inventive concepts are not limited thereto, and the compensation switch SW1 may be implemented as a PMOS transistor, a transmission gate, or another type of switching device. The compensation switch SW1 may be controlled to be turned on and turned off by a compensation control signal BC. The compensation switch SW1 may be turned on in response to the compensation control signal BC of the high level in the bit line precharge period, and the current source may sink a predetermined or alternatively, desired compensation current. In some embodiments, the compensation current may be set to be the same as or similar to the leakage current flowing into the word line WL. Thus, the leakage current may be compensated by the current source.

Figure 21:
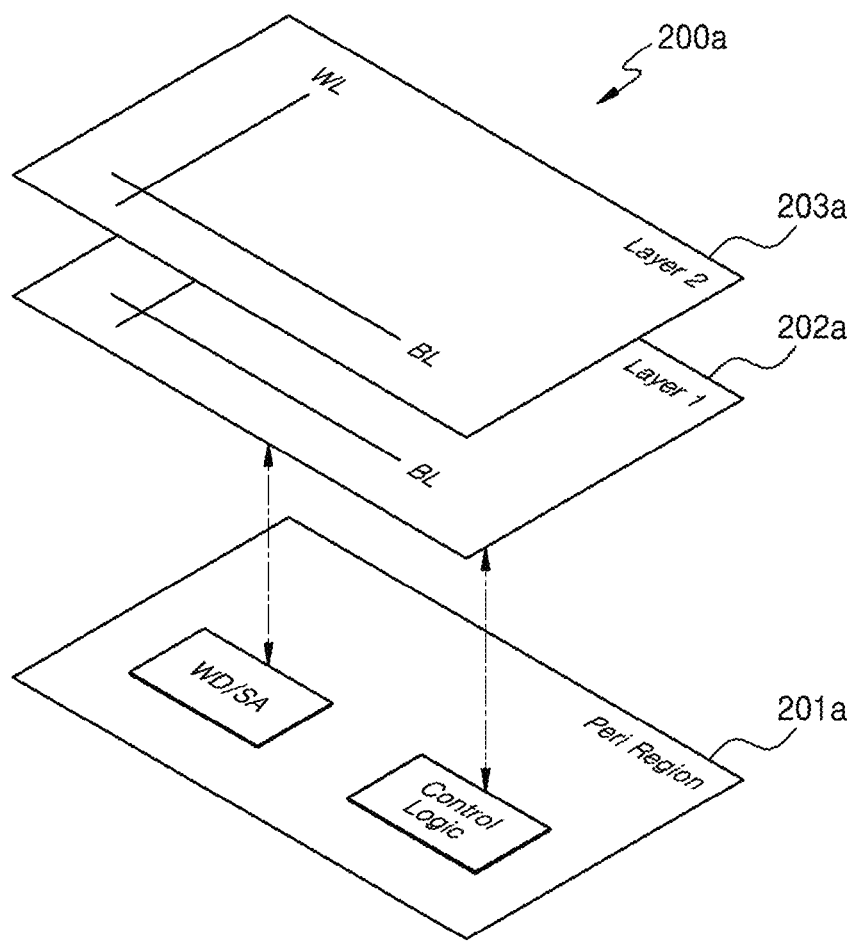
FIG. 21 is a diagram illustrating an example in which embodiments of the inventive concepts are applied to a 3D memory device.

FIG. 21 is a diagram illustrating an example in which embodiments of the inventive concepts are applied to the 3D memory device. In FIG. 21, a memory cell array is illustrated as including the first and second layers, but a larger number of layers may be provided in the memory cell array.

Referring to FIG. 21, the memory device may include a peri (peripheral) layer 201a in which a peri (peripheral) region including peripheral circuits is disposed, and a first layer 202a and a second layer 203a in which memory cells are disposed. Each of the first layer 202a and the second layer 203a may include the plurality of memory cells and word lines/bit lines connected thereto. In addition, although an example in which the peri layer 201a includes a write driver/sense amplifier and a control logic is illustrated in FIG. 21, various types of peripheral circuits related to memory operations may be provided in the peri layer. In addition, the write driver/sense amplifier may be shared by the first layer 202a and the second layer 203a.

As described above with reference to FIGS. 5A and 5B, the first layer 202a and the second layer 203a may share at least one signal line in the 3D memory device. The first layer 202a and the second layer 203a may share the word line or the bit line. In the plurality of layers of the stacked structure, the word line and the bit line of the second layer 202a may have a greater capacitance component (or larger loading) than the word line and the bit line of the first layer 201a, and according to example embodiments of the inventive concepts described above, in the data read operation, word line selection signals applied to the word line selection transistor may be differently controlled in the first layer 201a and the second layer 202a. In addition, according to example embodiments of the inventive concepts described above, in the data read operation, unselected word lines adjacent to the selected word line may be differently controlled in the first layer 201a and the second layer 202a.

Figure 22:
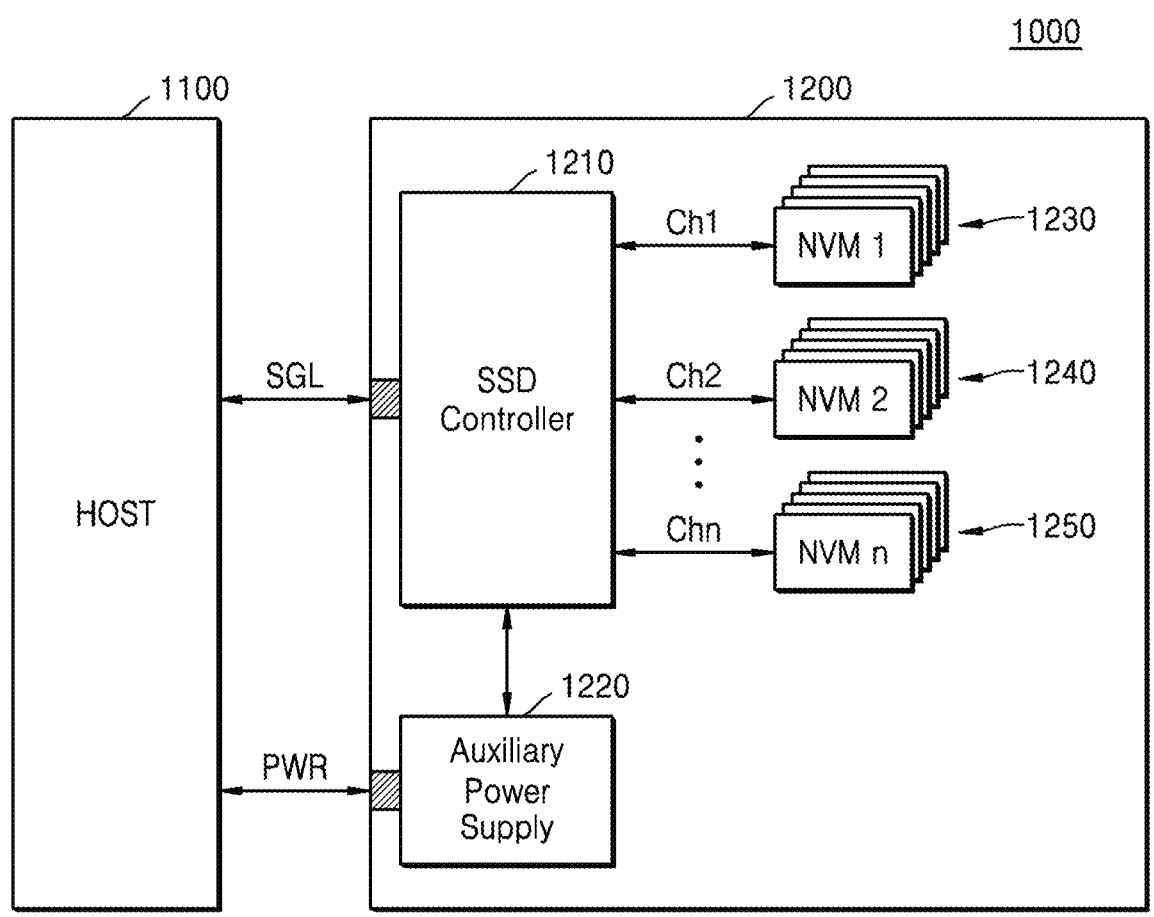
FIG. 22 is a block diagram illustrating an example in which a memory device according to embodiments of the inventive concepts is applied to an SSD system.

FIG. 22 is a block diagram illustrating an example in which a memory device according to embodiments of the inventive concepts is applied to an SSD system.

Referring to FIG. 22, the SSD system 1000 may include a host 1100 and an SSD 1200. The SSD 1200 may exchange signals with the host 1100 through a signal connector and may receive power through a power connector. The SSD 1200 may include an SSD controller 1210, an auxiliary power supply 1220, and a plurality of nonvolatile memory devices 1230, 1240, and 1250. At least one of the plurality of nonvolatile memory devices 1230, 1240, and 1250 may be a resistive memory device, and the memory device according to example embodiments of the inventive concepts may be applied as one of the plurality of nonvolatile memory devices 1230, 1240, and 1250.

The SSD controller 1210 may be connected to the plurality of memory devices 1230, 1240, and 1250 through a plurality of channels Ch1 to Chn, and thus may store data in the plurality of memory devices 1230, 1240 and 1250 or may read data from the plurality of memory devices 1230, 1240, and 1250.

Figure 23:
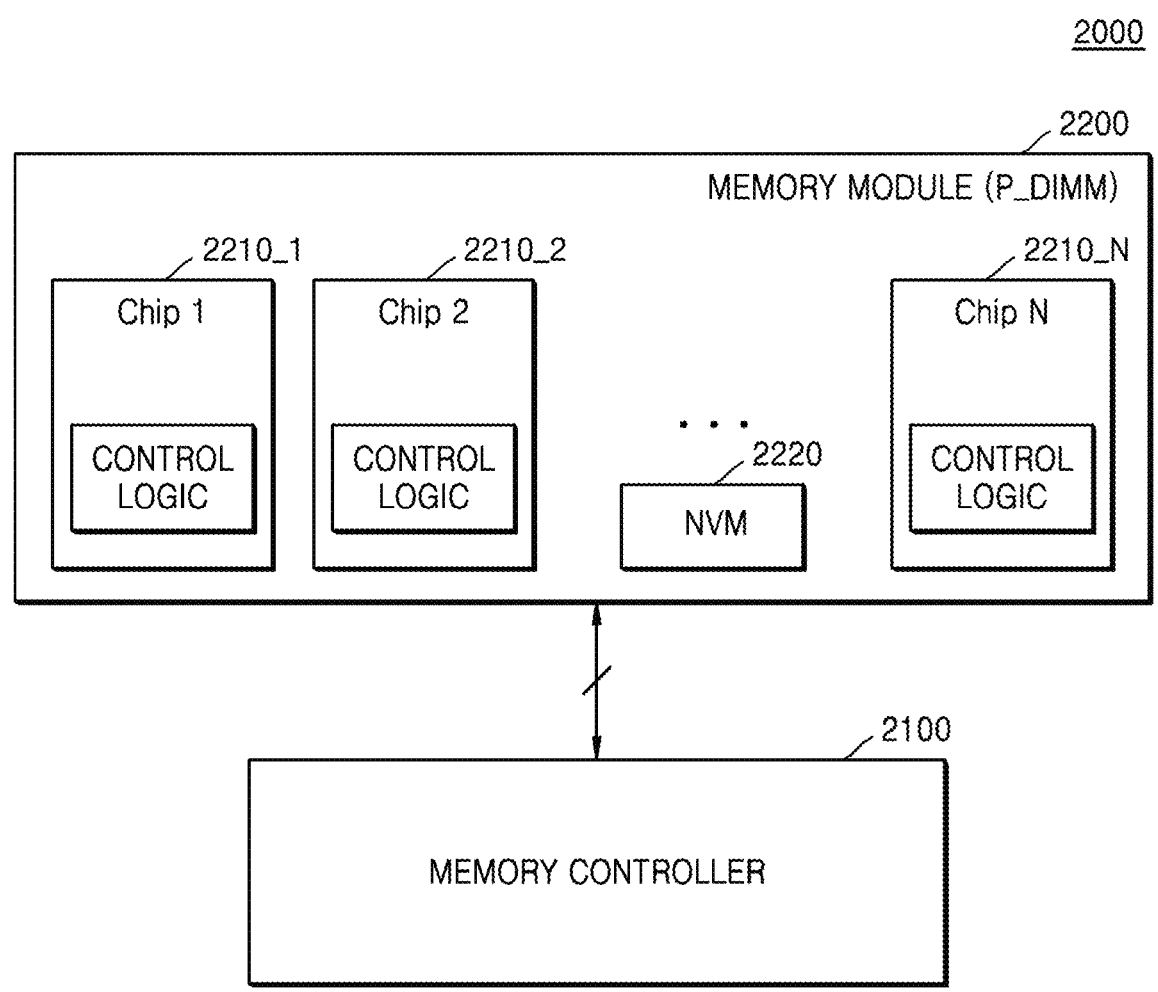
FIG. 23 is a block diagram illustrating an example of implementation of a memory system according to various embodiments of inventive concepts.

FIG. 23 is a block diagram illustrating an implementation of a memory system according to various embodiments of inventive concepts. In FIG. 23, an example in which a memory system 2000 include a memory module 2200 is illustrated, and the memory module 2200 may correspond to the memory device in the above-described embodiment or may include a plurality of memory devices in the above-described embodiment.

Referring to FIG. 23, a memory controller 2100 may control overall operations of the memory system 2000. Although not shown in FIG. 23, the memory controller 2100 may further include various other components, such as a command/address generator, a host I/F, and a memory I/F, as components for controlling memory operations.

The memory module 2200 may include a plurality of memory chips mounted on a module board. For example, the memory module 2200 may include first to N-th memory chips 2210_1 to 2210_N. In addition, each of the first to N-th memory chips 2210_1 to 2210_N may correspond to the memory device in the above-described embodiments, and accordingly, each of the first to N-th memory chips 2210_1 to 2210_N may include control logic for performing various control operations related to data reading in the above-described embodiments. For example, in the data read operation of the first to N-th memory chips 2210_1 to 2210_N, the word line selection transistor may be weakly turned on in the bit line precharge period, and the voltage level of the word line selection signal applied to weakly turn on the word line selection transistor may be different in the first layer and the second layer. In addition, unselected word lines adjacent to the selected word line may be floated in the bit line precharge period, and the number of the floated unselected word lines in the first layer and the second layer may be different.

The memory module 2200 may be implemented in the form of a single in-line memory module (SIMM) or a dual inline memory module (DIMM). In addition, the memory module 2200 may correspond to various types of DIMMs, and various types of DIMMs such as FB-DIMMs and LR-DIMMs may be applied to the memory modules 2200. Alternatively, the memory module 2200 may correspond to a nonvolatile DIMM (NVDIMM) in which the nonvolatile memory 2220 is mounted to compensate for the problem of volatile memory in which data is lost when the power is terminated.

In addition, as various types of modules, when the memory module 2200 includes PRAM as a resistive memory, the memory module 2200 may be referred to as P_DIMM. Embodiments of the inventive concepts may be applied to various types of modules besides the above. For example, as the memory module 2200 may include cross-point memory chips having resistive memory cells of 3D type, the memory module 2200 may be referred to as crosspoint DIMM or 3D crosspoint DIMM.

When the memory module 2200 corresponds to NVDIMM, the memory module 2200 may operate based on various kinds of specifications such as NVDIMM-N and NVDIMM-P. Accordingly, the nonvolatile memory 2220 may be used for data storage or buffer. In addition, each of the first to N-th memory chips 2210_1 to 2210_N may operate based on a double data rate (DDR) for transmitting and receiving data at the rising and falling edges of the clock. The memory module 2200 may be mounted in a DDR slot. For example, the memory module 2200 may be mounted in the DDR slot such as DDR4 or DDR5 to operate based on a corresponding specification. In addition, the memory device 200 of FIG. 1 according to the above-described embodiments may be used for implementing the nonvolatile memory 2220 of the memory module 2200.

Figure 24:
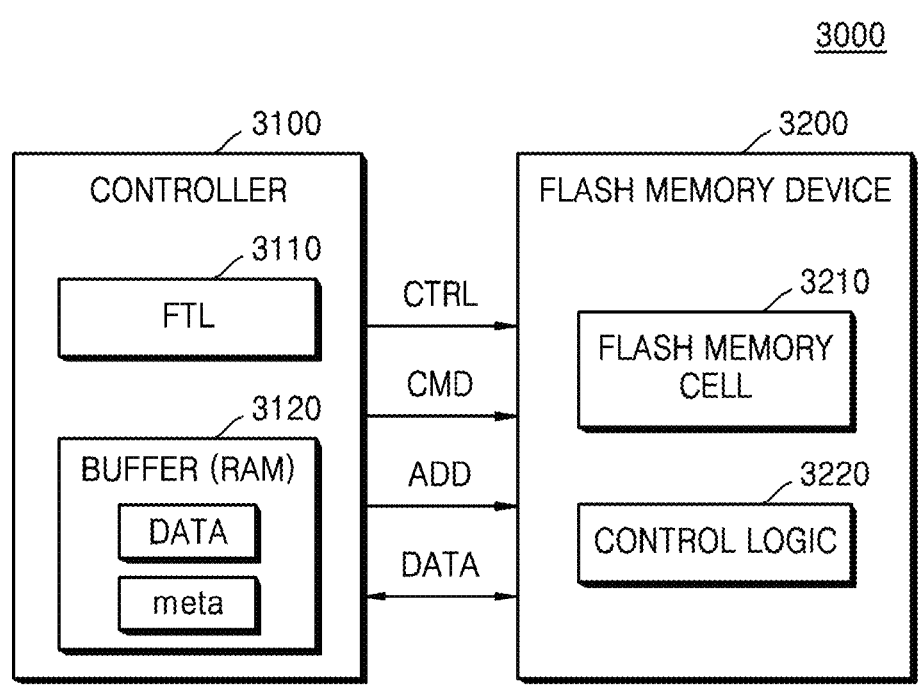
FIG. 24 is a block diagram illustrating an example in which a memory device according to embodiments of the inventive concepts is used as a buffer of a controller.

FIG. 24 is a block diagram illustrating an example in which a memory device according to embodiments of the inventive concepts is used as a buffer of a controller.

Referring to FIG. 24, a memory system 3000 may include a controller 3100 and a flash memory device 3200, and the flash memory device 3200 may include a flash memory cell 3210 and a control logic 3220. In addition, the memory controller 3100 may include a flash translation layer (FTL) 3110 and a buffer 3120 for temporarily storing data DATA and meta data provided to the flash memory device 3200. The controller 3100 may control the flash memory device 3200 to read data stored in the flash memory cell 3210 or program data to the flash memory cell 3210 in response to a write/read request from the host. In detail, the controller 3100 may control the program, read, and erase operations with respect to the flash memory device 3200 by providing an address ADDR, a command CMD, and a control signal CTRL to the flash memory device 3200.

The buffer 3120 may include a memory device according to the above-described embodiments, and thus the buffer 3120 may include a resistive memory device. In addition, according to the above-described embodiments, the data sensing operation may be performed based on the pseudo-floating operation of the word line and/or the bit line in temporarily storing and reading data DATA and metadata in the resistive memory device.

The memory controller 130, as well as any other element described above (for example, memory controller 100, read/write circuit 220, control logic 230, etc.) may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In the above-described embodiments, the memory device is described as including a resistive memory, but embodiments of the inventive concepts need not be limited thereto. As an example, embodiments of the inventive concepts may be applied to various types of memory devices that perform data sensing based on precharge operations on word lines and/or bit lines. For example, embodiments of the inventive concepts may be applied to various types of volatile and nonvolatile memories such as DRAM, mobile DRAM, SRAM or flash memory devices.

While the inventive concepts have been particularly shown and described with reference to embodiments thereof, it will be understood that various changes in form and details may be made therein without departing from the spirit and scope of the following claims.

What is claimed is:

1. A memory device comprising:
a memory cell array comprising a plurality of memory cells in an area where a plurality of word lines and a plurality of bit lines cross each other;

a row decoder comprising a plurality of row switches corresponding to the plurality of word lines and configured to perform a selection operation on the plurality of word lines;

a column decoder comprising a plurality of column switches corresponding to the bit lines and configured to perform a selection operation on the plurality of bit lines; and a control logic configured to control a precharge operation to be performed on a selected word line connected to a selected memory cell in a word line precharge period in a data read operation, and to control a precharge operation to be performed on a selected bit line connected to the selected memory cell in a bit line precharge period after the word line precharge period;

wherein the row switch connected to the selected word line is weakly turned on in the bit line precharge period.

2. The memory device of claim 1, further comprising a sensing amplifier connected to the selected word line to detect data of the selected memory cell by comparing a voltage of the selected word line to a reference voltage.

3. The memory device of claim 1, wherein
the row switch is turned on to precharge the selected word line in the word line precharge period, and
the row switch is weakly turned on in the bit line precharge period, so that the selected word line is pseudo-floated.

4. The memory device of claim 1, wherein a control signal of weak-on level is applied to the row switch in the bit line precharge period, in which the weak-on level is a level between an on level for turning on the row switch and an off level for turning off the row switch.

5. The memory device of claim 4, wherein
the row switch includes a transistor comprising a drain terminal connected to the selected word line, a gate terminal to which the control signal is applied, and a source terminal connected to a data line, and
the weak-on level of the control signal is lower than the on level and higher than the off level.

6. The memory device of claim 4, wherein the memory cell array each comprises a plurality of memory cells and each comprises a first layer and a second layer stacked vertically, and
wherein, when a read operation is performed on a first memory cell of the first layer, a control signal of a first level is applied to a first row switch connected to the first memory cell in the bit line precharge period, and
when the read operation is performed on a second memory cell of the second layer, a control signal of a second level is applied to a second row switch connected to the second memory cell in the bit line precharge period, and the first level and the second level are different.

7. The memory device of claim 6, wherein
the first level is a level between the on level and the off level, and
the second level is the off level.

8. The memory device of claim 6, wherein the first level and the second level are levels between the on level and the off level.

9. The memory device of claim 6, wherein the first layer and the second layer share the plurality of bit lines.

10. The memory device of claim 6, wherein each of the first memory cell of the first layer and the second memory cell of the second layer comprises a selection device layer and a variable resistance layer stacked on the selection device layer.

11. The memory device of claim 6, wherein
the first memory cell of the first layer comprises a first selection device layer stacked on a first word line, a first variable resistance layer stacked on the first selection device layer, and the bit line stacked on the first variable resistance layer, and
the second memory cell of the second layer comprises a second selection device layer stacked on a second word line, a second variable resistance layer stacked on the second selection device layer, and a second word line stacked on the second variable resistance layer.

12. The memory device of claim 4, wherein the plurality of memory cells includes a first memory cell and a second memory cell positioned further from the column decoder than the first memory cell, and
wherein, when a read operation is performed on the first memory cell, a control signal of a third level is applied to a first row switch connected to the first memory cell in the bit line precharge period, and
when the read operation is performed on a second memory cell, a control signal of a fourth level is applied to a second row switch connected to the second memory cell in the bit line precharge period, and the third level and the fourth level are different.

13. The memory device of claim 12, wherein the third level and the fourth level are levels between the on level and the off level, wherein the fourth level is higher than the third level.

14. The memory device of claim 1, further comprising a compensating switch and a current source connected to the selected word line,
wherein as the compensation switch is turned on in the bit line precharge period and the current source is electrically connected to the word line, a leakage current to be generated in the word line is compensated.

15. The memory device of claim 1, wherein each of the plurality of memory cells comprises a variable resistive device comprising a phase change material.

16. A memory device comprising:
a memory cell array comprising a first layer and a second layer which share a plurality of bit lines and are stacked, wherein each of the first layer and the second layer comprises a plurality of memory cells in an area where a plurality of word lines and the plurality of bit lines cross each other;
a row decoder comprising a plurality of row switches corresponding to the plurality of word lines and configured to perform a selection operation on the plurality of word lines;
a column decoder comprising a plurality of column switches corresponding to the plurality of bit lines and configured to perform a selection operation on the plurality of bit lines;
a word line precharge device configured to apply a word line precharge voltage to a selected word line selected by the row decoder in a word line precharge period;
a bit line precharge device configured to apply a bit line precharge voltage to a selected bit line selected by the column decoder in a bit line precharge period; and
a comparator comparing a voltage of the selected word line to a reference voltage and outputting a comparison result,
wherein when a data read operation is performed on a first memory cell of the first layer, a first word line selection signal of a first level is applied to a first row switch connected to the first memory cell for turning on the first row switch in the word line precharge period, and the first word line selection signal of a third level between a second level and the first level is applied to the first row switch for turning off the first row switch in the bit line precharge period.

17. The memory device of claim 16, wherein,
when a data read operation is performed on a second memory cell of the second layer, a second word line selection signal of a first level is applied to a second row switch connected to the second memory cell in the word line precharge period, and the second word line selection signal of the second level is applied to the second row switch in the bit line precharge period.

18. The memory device of claim 17, wherein,
when the data read operation is performed on the first memory cell, a first word line connected between the first memory cell and the first row switch is pseudo-floated in the bit line precharge period, and
when the data read operation is performed on the second memory cell, a second word line connected between the second memory cell and the second row switch is floated in the bit line precharge period.

19. The memory device of claim 18, wherein,
when the data read operation is performed on the first memory cell, an inhibit voltage is applied to unselected word lines of the first layer in the bit line precharge period, and
when the data read operation is performed on the second memory cell, at least one unselected word line among the unselected word lines of the second layer is floated in the bit line precharge period.

20. A memory module comprising:
a module board;
a plurality of memory chips on the module board; and
a nonvolatile memory on the module board and communicating with the plurality of memory chips,
each of the plurality of memory chips comprising:
a memory cell array comprising a first layer and a second layer which share a plurality of bit lines and are stacked, wherein each of the first layer and the second layer comprises a plurality of memory cells in an area where a plurality of word lines and the plurality of bit lines cross each other;
a row decoder comprising a plurality of row switches corresponding to the plurality of word lines and configured to perform a selection operation on the plurality of word lines;
a column decoder comprising a plurality of column switches corresponding to the plurality of bit lines and configured to perform a selection operation on the plurality of bit lines; and
a control logic configured to control precharge operations on a word line and a bit line of a selected memory cell,
wherein, when a read operation is performed on a first memory cell of the first layer, a first word line selection signal of a weak-on level is applied to a first row switch connected to the first memory cell in a bit line precharge period, and
wherein, when a read operation is performed on a second memory cell of the second layer, a second word line selection signal of an off level is applied to a second row switch connected to the second memory cell in a bit line precharge period.

21. The memory device of claim 18, wherein a capacitance of the first word line of the first layer is less than a capacitance of the second word line of the second layer.

22. The memory device of claim 18, wherein,
when the data read operation is performed on the first memory cell, N unselected word lines (N is a positive integer) among the unselected word lines of the first layer are floated in the bit line precharge period,
when the data read operation is performed on the second memory cell, M unselected word lines among unselected word lines of the second layer are floated in the bit line precharge period, and wherein M is a positive integer greater than N.

23. The memory module of claim 20, wherein the memory module is operated based on a specification according to non-volatile dual-inline memory module (NVDIMM)-P or NVDIMM-N.

24. A memory device comprising:
a memory cell array comprising a first layer and a second layer which share a plurality of bit lines and are stacked vertically, wherein each of the first layer and the second layer comprises a plurality of memory cells in an area where a plurality of word lines and the plurality of bit lines cross each other;
a row decoder comprising a plurality of row switches corresponding to the plurality of word lines and configured to perform a selection operation on the plurality of word lines;
a column decoder comprising a plurality of column switches corresponding to the bit lines and configured to perform a selection operation on the plurality of bit lines;
a read circuit configured to read data of a selected memory cell based on a voltage level of a selected word line connected to the selected memory cell among the plurality of memory cells; and
a control logic for controlling such that when a data reading is performed on a first memory cell of the first layer, N (N is zero or a positive integer) unselected word lines among a plurality of unselected word lines of the first layer are floated, and when the data read operation is performed on a second memory cell of the second layer, M (M is a positive integer greater than N) unselected word lines among the plurality of unselected word lines of the second layer are floated.

25. The memory device of claim 24, wherein an inhibit voltage is applied to the plurality of unselected word lines of the first layer, and
wherein at least one unselected word line among the plurality of unselected word lines of the second layer is floated, and the inhibit voltage is applied to another unselected word line.

26. The memory device of claim 25, wherein an unselected word line closest to the selected word line among the plurality of unselected word lines of the second layer is floated.

* * * * *